(12) United States Patent
Hsieh et al.

(10) Patent No.: US 10,326,065 B2
(45) Date of Patent: Jun. 18, 2019

(54) LIGHT-EMITTING ARRAY

(71) Applicant: EPISTAR CORPORATION, Hsinchu (TW)

(72) Inventors: Min-Hsun Hsieh, Hsinchu (TW);
Guan-Ru He, Hsinchu (TW);
Chao-Hsing Chen, Hsinchu (TW);
Jui-Hung Yeh, Hsinchu (TW);
Chia-Liang Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 15/652,987

(22) Filed: Jul. 18, 2017

(65) Prior Publication Data

US 2017/0317255 A1    Nov. 2, 2017

Related U.S. Application Data

(63) Continuation of application No. 14/657,714, filed on Mar. 13, 2015, now abandoned.

(60) Provisional application No. 61/953,236, filed on Mar. 14, 2014, provisional application No. 61/973,394, filed on Apr. 1, 2014, provisional application No. 61/973,423, filed on Apr. 1, 2014.

(51) Int. Cl.
| | |
|---|---|
| *H01L 33/62* | (2010.01) |
| *H01L 25/075* | (2006.01) |
| *H01L 33/36* | (2010.01) |
| *H01L 33/38* | (2010.01) |
| *H01L 21/56* | (2006.01) |

(52) U.S. Cl.
CPC .......... *H01L 33/62* (2013.01); *H01L 25/0753* (2013.01); *H01L 21/568* (2013.01); *H01L 33/36* (2013.01); *H01L 33/38* (2013.01); *H01L 2224/04105* (2013.01); *H01L 2224/18* (2013.01); *H01L 2224/19* (2013.01); *H01L 2924/3512* (2013.01)

(58) Field of Classification Search
CPC ................. H01L 33/62; H01L 25/0753; H01L 2224/04105; H01L 21/568; H01L 2224/19; H01L 2924/3512; H01L 2224/18; H01L 33/36; H01L 33/38; H01L 33/385; H01L 33/387
See application file for complete search history.

(56) References Cited

U.S. PATENT DOCUMENTS

| | | | |
|---|---|---|---|
| 5,563,422 A * | 10/1996 | Nakamura | ........ H01L 21/28575 257/103 |
| 6,307,218 B1 | 10/2001 | Steigerwald et al. | |
| 2002/0094701 A1* | 7/2002 | Biegelsen | .............. B25J 13/084 439/32 |
| 2003/0107053 A1 | 6/2003 | Uemura et al. | |
| 2004/0026702 A1* | 2/2004 | Yamada | .................. H01L 33/38 257/80 |
| 2006/0192223 A1 | 8/2006 | Lee et al. | |
| 2009/0039376 A1 | 2/2009 | Uemoto et al. | |
| (Continued) | | | |

*Primary Examiner* — Su C Kim
(74) *Attorney, Agent, or Firm* — Muncy, Geissler, Olds & Lowe, P.C.

(57) ABSTRACT

The present application discloses a light-emitting array, comprising a first light-emitting chip; a second light-emitting chip; and a conductive line electrically connected to the first light-emitting chip and the second light-emitting chip, wherein the conductive line includes a first segment and a second segment having a radius curvature different from that of the first segment.

6 Claims, 36 Drawing Sheets

(56) References Cited

U.S. PATENT DOCUMENTS

| | | | |
|---|---|---|---|
| 2011/0089442 A1 | 4/2011 | Jing et al. | |
| 2012/0126276 A1* | 5/2012 | Hori | H01L 33/405 257/98 |
| 2012/0175665 A1 | 7/2012 | Lim et al. | |
| 2013/0105825 A1* | 5/2013 | Liu | H01L 25/0753 257/88 |
| 2013/0264591 A1* | 10/2013 | Hussell | H01L 33/36 257/88 |
| 2014/0070235 A1 | 3/2014 | Andrews et al. | |
| 2014/0220422 A1* | 8/2014 | Rogers | H01L 23/18 429/163 |

\* cited by examiner

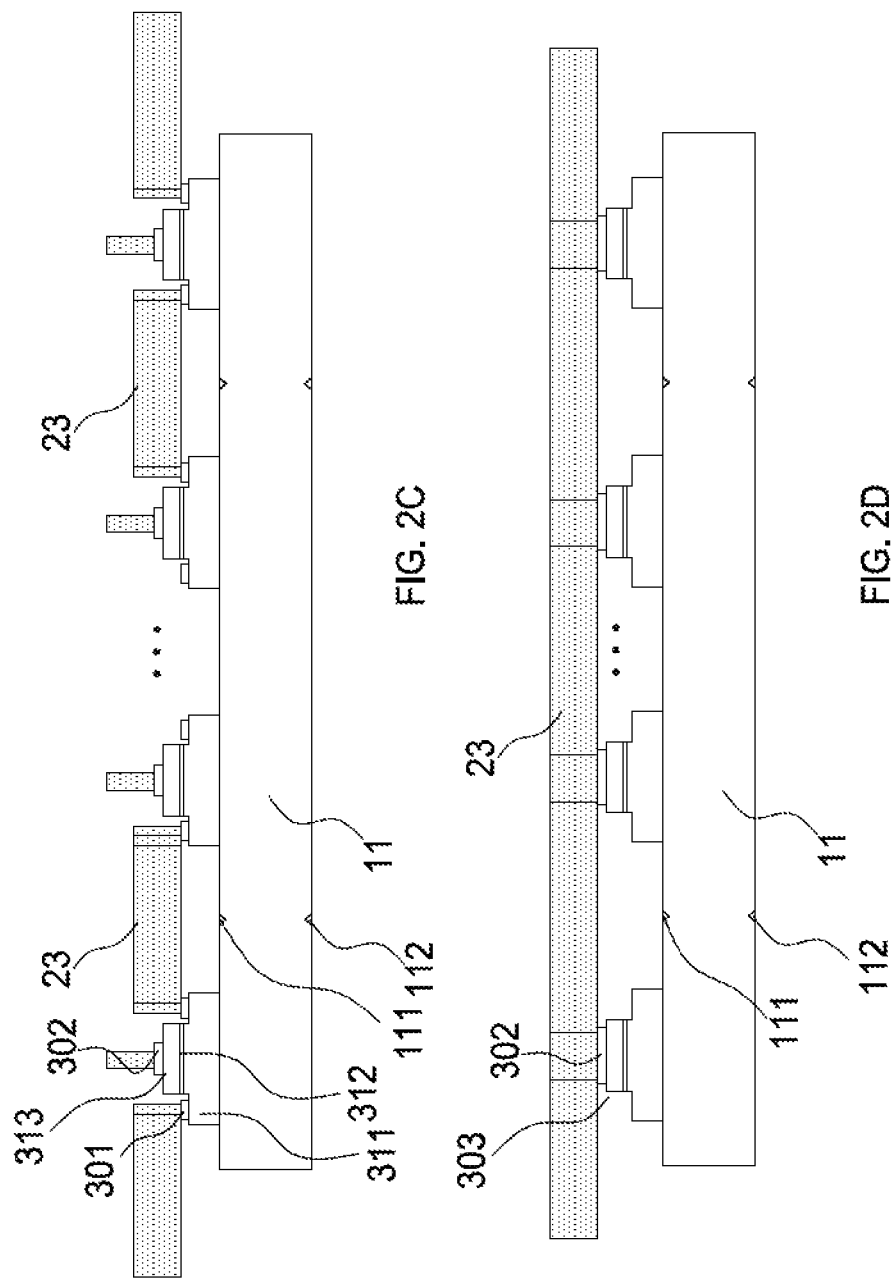

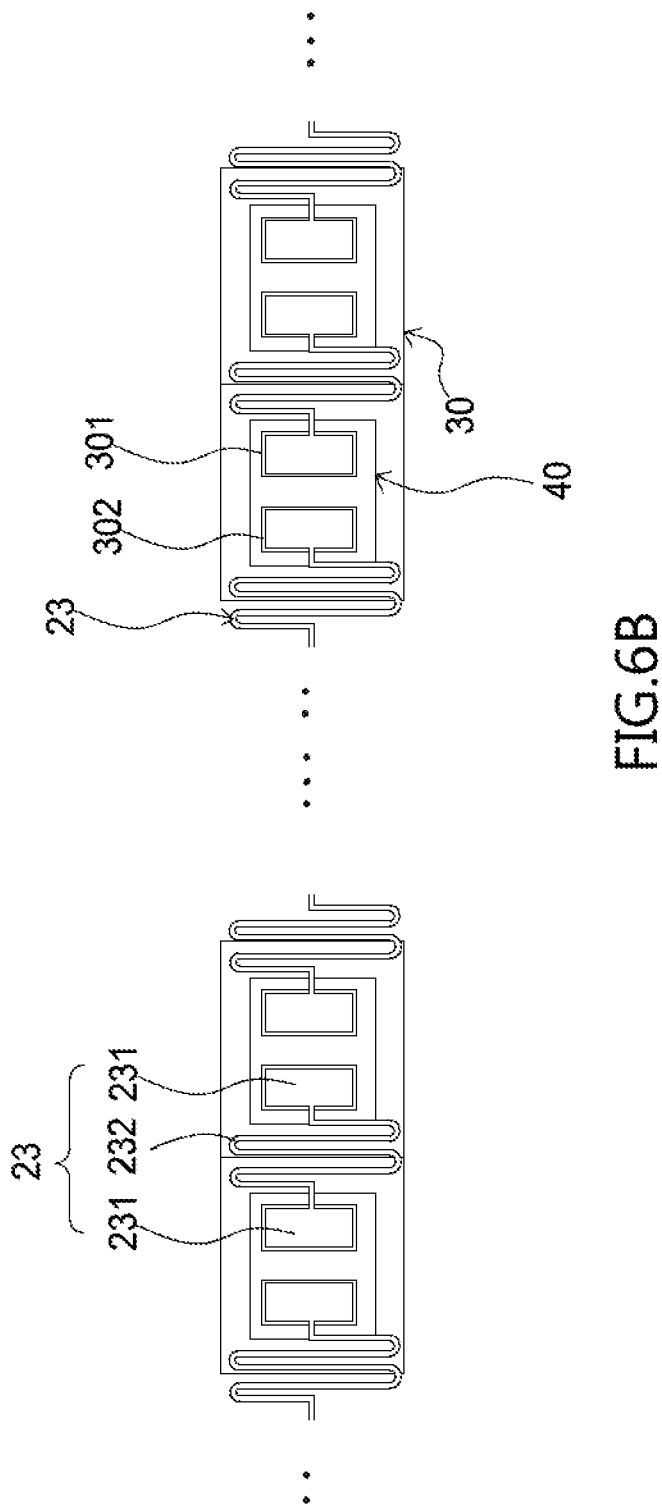

LIGHT-EMITTING ARRAY

CROSS-REFERENCE TO RELATED APPLICATIONS

This application is a Continuation of co-pending application Ser. No. 14/657,714 filed on Mar. 13, 2015, for which priority is claimed under 35 U.S.C. § 120; and this application claims priority of U.S. Provisional Application Nos. 61/953,236 filed on Mar. 14, 2014, 61/973,394 filed on Apr. 1, 2014, and 61/973,423 filed on Apr. 1, 2014 under 35 U.S.C. § 119(e); the entire contents of all of which are hereby incorporated by reference.

BACKGROUND OF THE INVENTION

Field of the Invention

The present application discloses a light-emitting array comprising multiple semiconductor light-emitting stacks and conductive wires connecting the semiconductor light-emitting stacks.

Brief Description of the Related Art

Following incandescent light, traditional lighting devices have been gradually substituted by solid-state lighting devices consisted of the light-emitting diodes because the light-emitting diodes (LEDs) have the characteristics of low power consumption, environment friendly, long life span, and compact. Moreover, the LED capable of emitting a white light has a strong need in the market.

Thus, the LED is gradually adopted in several aspects of applications. For example, some monitors are using LEDs as the light-emitting units of a backlight module, and some cameras or cellphones adopt LEDs as the flash lights. Furthermore, the LED not only provides luminance for people to see the object; in some products, the LEDs are applied to pixels of a display, that is the LED is formed in an LED based monitor, such as an LED TV, or formed in an outdoor billboard for the benefit of high reliability against the sunlight, wind or rain.

SUMMARY OF THE DISCLOSURE

An light-emitting array, comprising a first light-emitting chip; a second light-emitting chip; and a conductive line electrically connecting to the first light-emitting chip and the second light-emitting chip, wherein the conductive line comprises a first segment and a second segment having a radius curvature different from that of the first portion.

BRIEF DESCRIPTION OF THE DRAWINGS

FIGS. 2C-2D show cross-sectional views along V-V' line and along U-U' line in FIG. 2A.

FIG. 6B shows a top view of a light-emitting array in an un-stretched state in accordance with an embodiment of the present invention.

DETAILED DESCRIPTION OF THE PREFERRED EMBODIMENTS

To better and concisely explain the disclosure, the same name or the same reference number given or appeared in different paragraphs or figures along the specification should has the same or equivalent meanings while it is once defined anywhere in the disclosure.

The following shows the description of the embodiments of the present disclosure in accordance with the drawings.

Figure 1A:
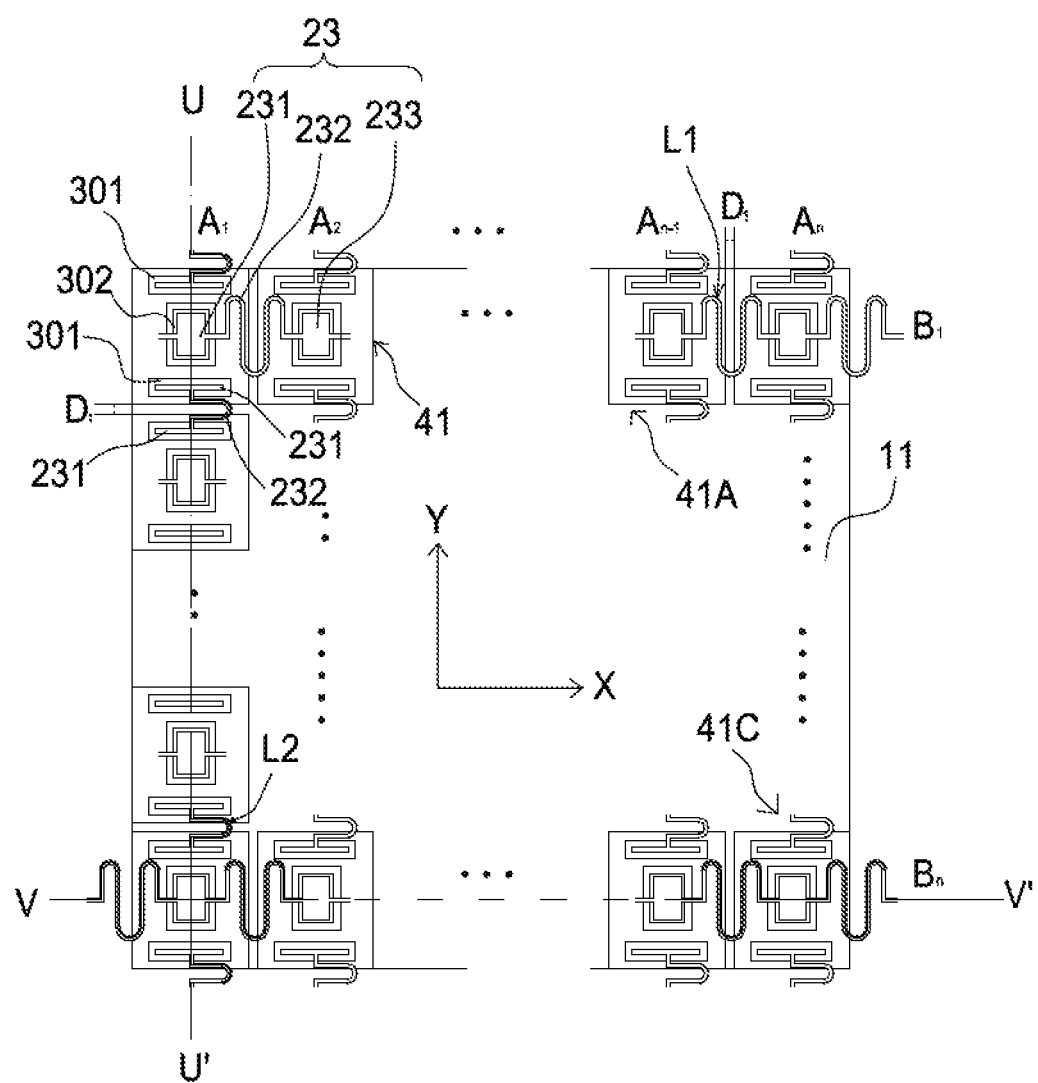
FIG. 1A shows a top view of a light-emitting array in an un-stretched state in accordance with an embodiment of the present invention.

FIG. 1A illustrates a top view of a light-emitting array in an un-stretched state in accordance with an embodiment of the present invention. The light-emitting array is a 2-dimension array and includes a plurality of light-emitting chips 41. Each of the light-emitting chips 41 has two first pads 301 (n-pad or p-pad) and a second pad 302 (p-pad or n-pad). The light-emitting chips 41 are electrically connected to each other by a plurality of extendable or stretchable conductive line 23 (A1-An and B1-Bn). Specifically, the second pads 302 of two adjacent light-emitting chips 41 are electrically connected by the conductive line 23 (B1-Bn). One of the first pads 301 of a light-emitting chips 41 is electrically connected to the other of the first pad 301 of adjacent light-emitting chip 41 by the conductive line 23 (A1-An). Therefore, for example, when the conductive lines 23 (An-1 and B1) are electrically connected to an external element (such as power supply or IC), the light-emitting chip 41A can emit light; when the conductive lines 23 (An and Bn) are electrically connected to the external element (power supply or IC), the light-emitting chip 41C can emit light. By selectively connecting the conductive line 23 with the external element, a specific light-emitting chip 41 can emit light. The light-emitting array can be used as a backlight for a display or formed to be an LED display. The light-emitting chips 41 are separated from each other on a substrate 11 by a distance (D1) larger than 1 mil. In one embodiment, the conductive line 23 has two connecting segments 231, and a stretchable segment 232 electrically and physically connected to the two connecting segments 231. The stretchable segment 232 further includes a portion having a radius curvature different from that of the connecting segment 231. To be more specific, the conductive line 23 connecting two adjacent light-emitting chips 41 arranged in an X direction has two connecting segments 231 and one stretchable segment 232. The stretchable segment 232 has a length (L1) and a curved or straight shape. The conductive line 23 connecting two adjacent light-emitting chips 41 arranged in a Y direction has two connecting segments 231 and one stretchable segment 232. The stretchable segment 232 has a length (L2) and a curved or straight shape. Moreover, it can have none, one or more connecting segments 231 formed on each light-emitting chip 41. If no connecting segment is formed, the stretchable segment 232 is directly connected to the light-emitting chip 41. If two or more connecting segments 231 are formed, each connecting segment 231 can be connected to at least one stretchable segment 232 in an X direction or in a Y direction.

In another embodiment, the width of the connecting segment 231 is larger than the width of the stretchable segment 232. However, various modifications and variations can be made to the conductive line 23 in accordance with the present disclosure without departing from the scope or spirit of the disclosure.

Figure 1B:
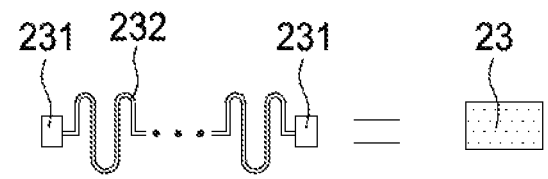
FIG. 1B shows a cross-sectional view along U-U' line in FIG. 1A.
Figure 1B:
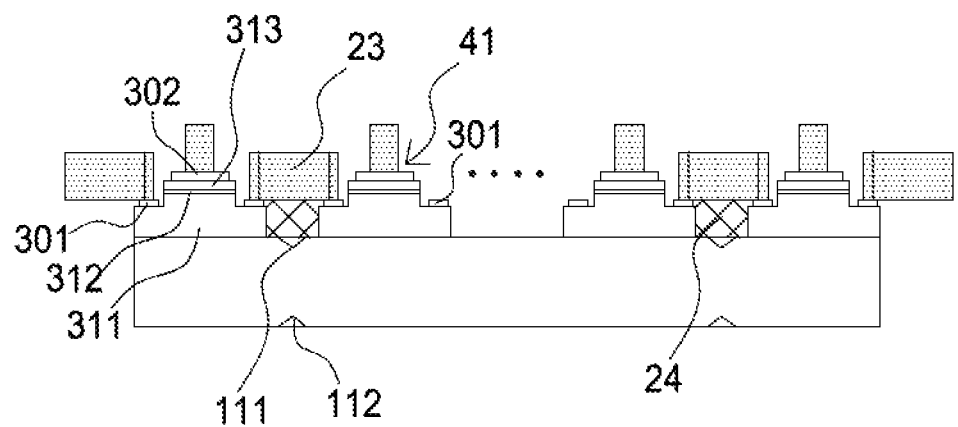

FIG. 1B shows a cross-sectional view along U-U' line in FIG. 1A. Each of the light-emitting chips 41 has a light-emitting stack, which includes a first-type semiconductor layer 311, an active layer 312, and a second-type semiconductor layer 313, which are epitaxially grown on the substrate 11 (sapphire, SiC, GaN or GaAs). The structure of the active layer 312 can be single heterostructure (SH), double heterostructure (DH), double-side double heterostructure (DDH) or multi-quantum well (MQW) structure. Each of the light-emitting chips 41 has two first pads 301 formed on the first-type semiconductor layer 311 and a second pad 302 formed on the second-type semiconductor layer 313. For example, the first pad 301 is an n-pad (or p-pad) and the second pad 302 is a p-pad (or n-pad). A plurality of first trenches 111 is formed on the substrate 11 between two adjacent light-emitting chips 41. The conductive line 23 electrically connects the first pads 301 of two adjacent light-emitting chips 41. The symbol of conductive line 23 in FIG. 1B represents one or more connecting segments 231 and a stretchable segment 232 as shown in FIG. 1B. A plurality of second trenches 112 is also formed on the other side of the substrate 11 opposite to the first trenches 111. The trench 111, 112 can be formed at the outermost surface of the substrate 11 by laser or within the substrate 11 by SD (Stealth Dicing) laser. It is noted that a scarified layer 24 is optionally formed between the conductive line 23 and the substrate 11 at a position corresponding to the first trench 111, the second trench 112, or both. The position of the trench 111 corresponding to the substrate 11 and the position of the trench 112 corresponding to the substrate 11 can be the same or different. The first-type semiconductor layer 311 and the second-type semiconductor layer 313 respectively provide electrons and holes such that electrons and holes can be combined in the active layer 312 to emit light. The active layer 312 can be made of AlxInyGa(1−x−y)P, wherein 0≤x, y≤1; (x+y)≤1, to emit a red light with a peak wavelength within a range between 610-650 nm; can be made of AlxInyGa(1−x−y)N, wherein 0≤x, y≤1; (x+y)≤1, to emit a green light with a peak wavelength within a range between 530-570 nm; or can be made of AlxInyGa(1−x−y)N, wherein 0≤x, y≤1; (x+y)≤1, to emit a blue light with a peak wavelength within a range between 450-490 nm. It is noted that the light-emitting chips 41 in the light-emitting array can emit different light. For example, one of the light-emitting chips 41 can emit a red light, and one of the light-emitting chips 41 can emit a blue light.

Figure 1C:
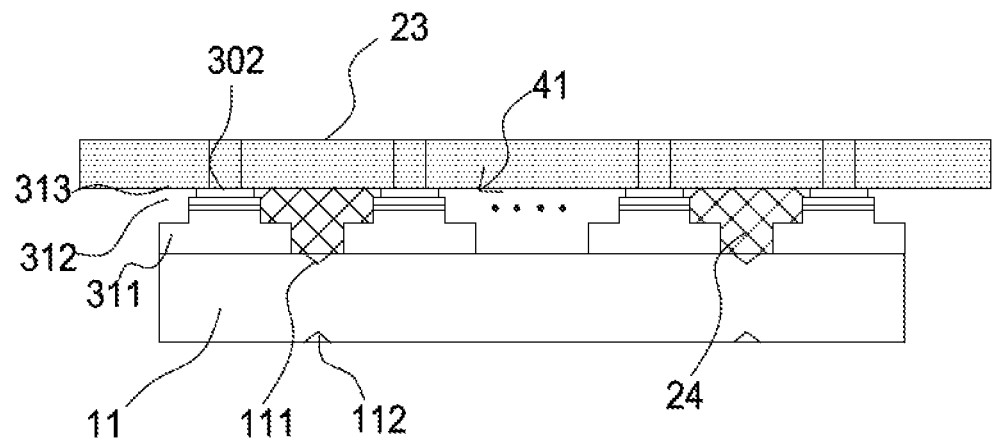
FIG. 1C shows a cross-sectional view along V-V' line in FIG. 1A.
Figure 1D:
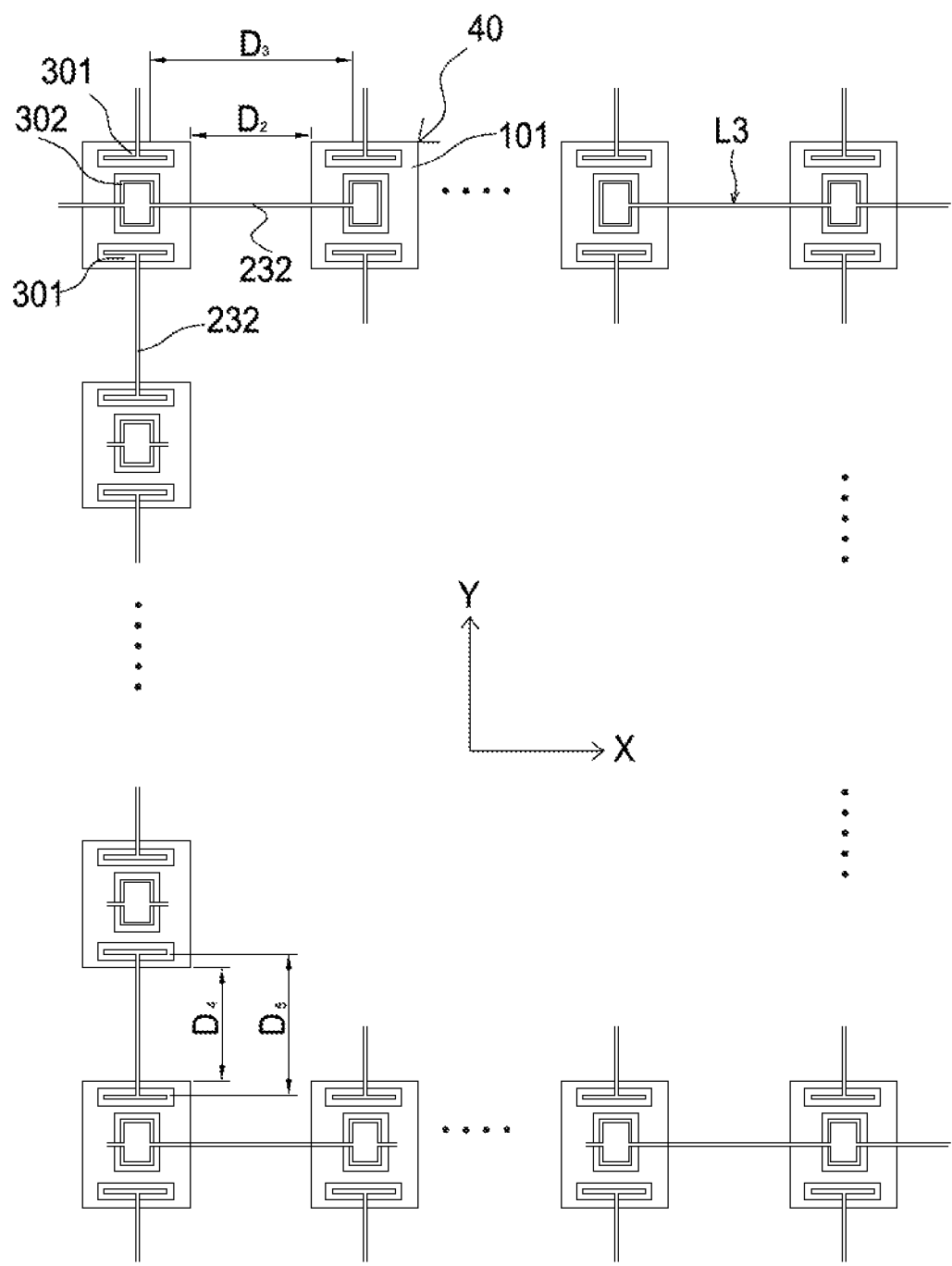
FIG. 1D shows a top view of the light-emitting array of FIG. 1A in a stretched state.

FIG. 1C shows a cross-sectional view along V-V' line in FIG. 1A. The conductive line 23 electrically connects the second pads 302 of two adjacent light-emitting chips 41 with each other. Before stretching, the light-emitting chips 41 are separated by the trench 111, 112 such that a plurality of separated light-emitting elements 40 as shown in FIGS. 1D and 7F is formed. A detail process is described below.

FIG. 1D shows a top view of the light-emitting array of the first embodiment in a stretched state. After forming a plurality of the light-emitting elements 40, a force is applied to the conductive line 23 or the light-emitting elements 40 in the X direction to stretch the stretchable segment 232. The light-emitting elements 40 are therefore moved away from each other, and the light-emitting elements 40 are separated by a distance (D2) larger than the distance (D1) in FIG. 1A in the X direction. As shown in FIGS. 1D and 1A, it is noted that the stretchable segment 232 has a length (L3) similar or equal to the length (L1). In other words, the length of the stretchable segment 232 is almost kept unchanged before and after stretching. The stretchable segment 232 is designed to have a curved or sinuous shape at initial, as illustrated in FIG. 1A, and the stretchable segment 232 is then to be stretched to be a straight line as shown in FIG. 1D. The stretched stretchable segment 232 can have a shape including but not limited to a straight line, a curved line, and a combination thereof. Moreover, the curved line can have one or more curvatures. The distance (D2) or a length of the stretchable segment 232 after stretching or a distance (D3) between two adjacent connecting segments 231 has a maximum value while the stretchable segment 232 is stretched to a maximum extent but not beyond its elastic limit. Therefore, the longer the length (L1), the larger the distance between two adjacent light-emitting elements 40 can be. In one embodiment, the distance (D3) can be in a range between a length in the un-stretched state (see FIG. 1A) and a length in the stretched state (see FIG. 1D), depending on requirements. It is noted that when the conductive line 23 is made of a rigid and elastic material, a line width of the stretchable segment 232 can be substantially the same before and after stretching. When the conductive line 23 is made of a ductile and malleable material, a line width of the stretchable segment 232 after stretching can be narrower than that before stretching. In an embodiment, the stretchable segment 232 has a line width of 5-15 μm before stretching and the stretchable segment 232 has a line width of 4-15 μm after stretching. The conductive line 23 is made of an elastic material, such as Cu, Al, Ag, Au or alloy thereof. In an embodiment, a ratio between the distance of two parallel conductive lines 23 arranged in X direction and a width of the light-emitting elements 40 in X direction is between 2 to 10. Likewise, another force is applied to the conductive line 23 or the light-emitting elements 40 in a Y direction to stretch the stretchable segment 232 of the conductive line 23, the light-emitting elements 40 are therefore moved away from each other. The light-emitting elements 40 are separated by a distance (D4) larger than the distance (D1) in FIG. 1A in the Y direction. As shown in FIGS. 1D and 1A, the stretchable segment 232 has a length (L4) similar to or equal to the length (L2). In other words, the length of the stretchable segment 232 is almost kept unchanged before and after stretching. The stretchable segment 232 has a curved or sinuous shape, as illustrated in FIG. 1A, however, the stretchable segment 232 is deformed to become a straight line in FIG. 1D. The stretched stretchable segment 232 can have a shape including but not limited to a straight line, a curved line, and a combination thereof. Moreover, the curved line can have one or more curvatures. A distance (D4) or a length of the stretchable segment 232 after stretching or a distance (D5) between the two first segments 231 of adjacent light-emitting elements 40 has a maximum value while the stretchable segment 232 is stretched to a maximum extent but not beyond its elastic limit. Therefore, the longer the length (L2), the larger the distance between two adjacent light-emitting elements 40 can be. In one embodiment, the distance (D5) can be in a range between a length in the un-stretched state (see FIG. 1A) and a length in the stretched state (see FIG. 1D), depending on the actual requirements.

Figure 1E:
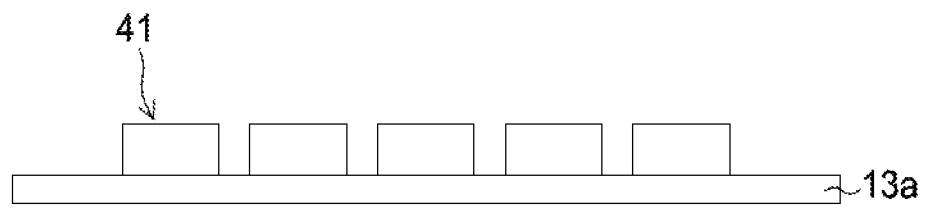
FIGS. 1E~1I show the process of manufacturing the structures in FIGS. 1A~1D.
Figure 1F:
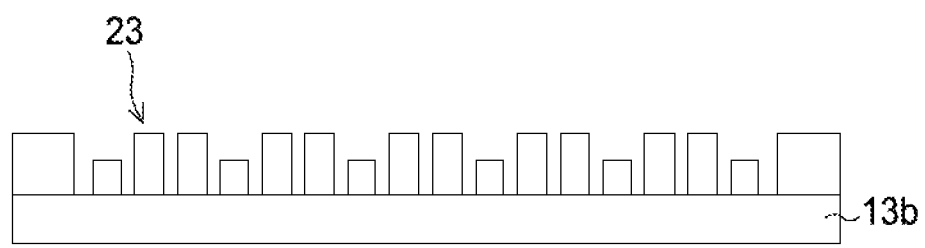
Figure 1G:
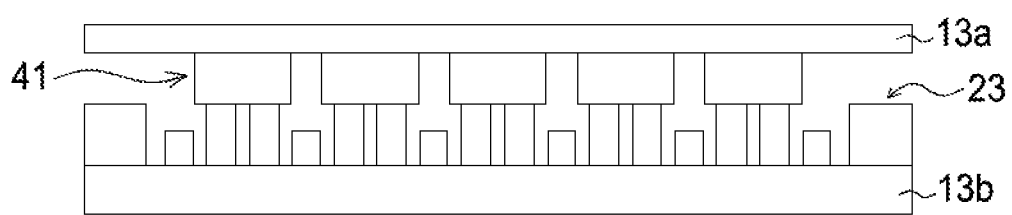
Figure 1H:
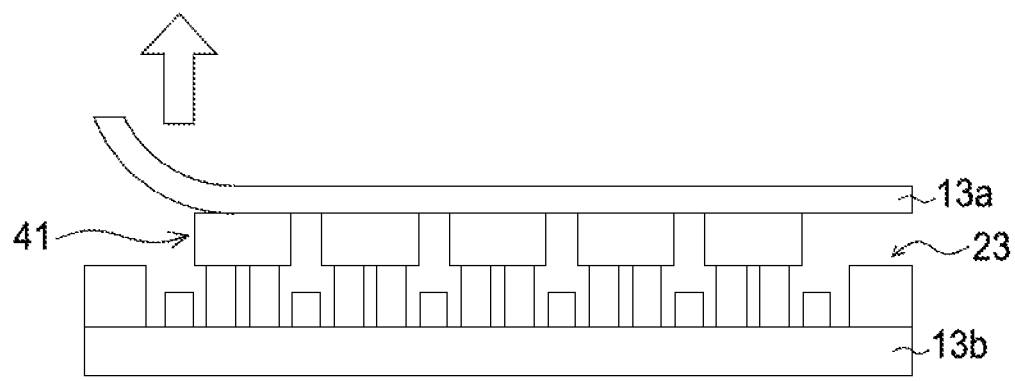
Figure 1I:
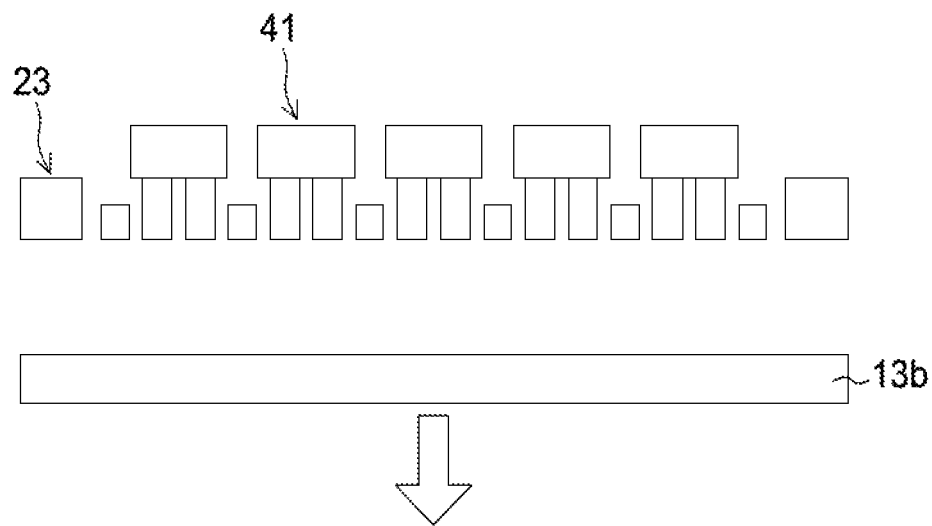

The process of manufacturing the structures in FIGS. 1A~1D is shown in FIGS. 1E~1I. Referring to FIGS. 1E-IF, the light-emitting chips 41 are formed on a first growth substrate 13a (or located on a first temporary substrate), and the conductive lines 23 are formed on a second growth substrate 13b (or located on a second temporary substrate). Referring to FIGS. 1G~1I, the light-emitting chips 41 and the conductive lines 23 are connected to each other; then, the first growth substrate 13a and the second growth substrate 13b are sequentially removed.

Figure 2A:
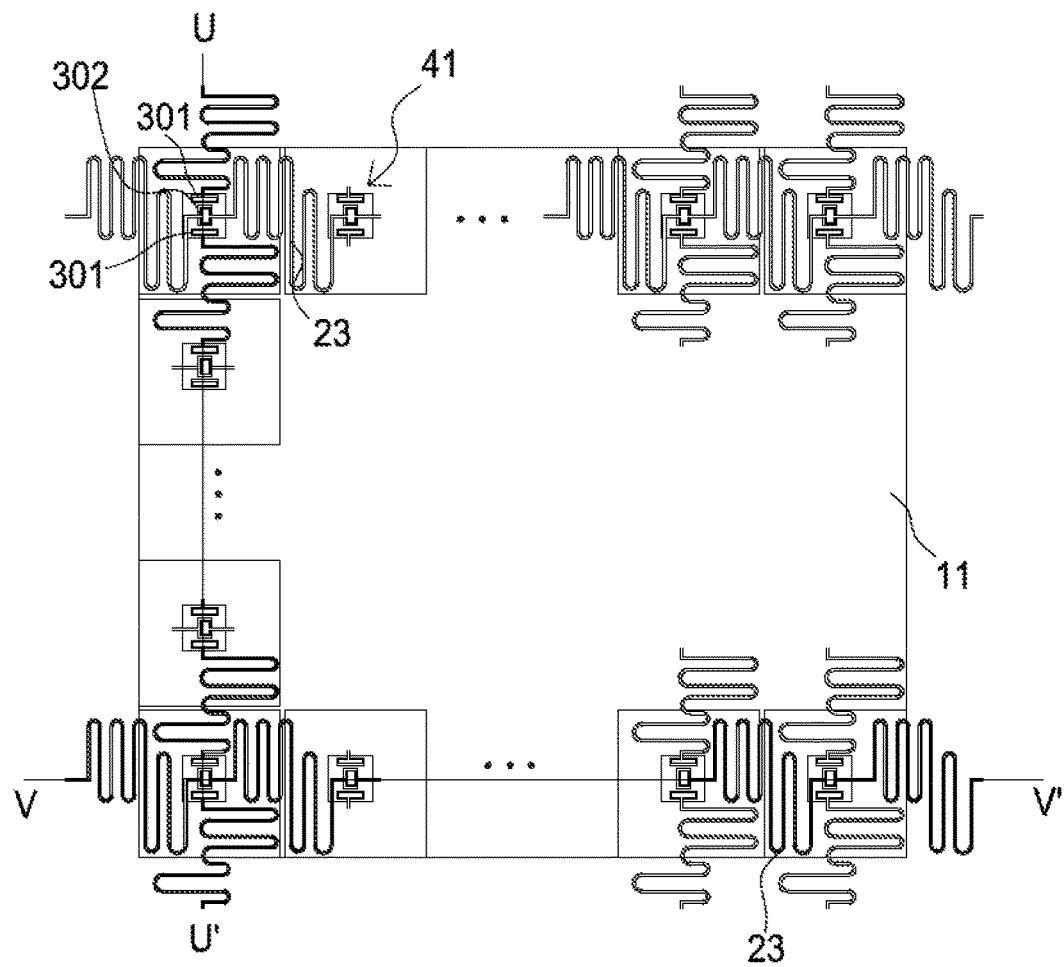
FIG. 2A shows a top view of a light-emitting array in an un-stretched state in accordance with further embodiment of the present invention.

FIG. 2A shows a top view of a light-emitting array in an un-stretched state in accordance with a second embodiment of the present invention. The light-emitting array of the second embodiment has a structure similar to that illustrated in the first embodiment. Compared with FIG. 1A, a larger distance is formed between two adjacent light-emitting chips 41, and the length of the stretchable segment 232 is increased.

Figure 2B:
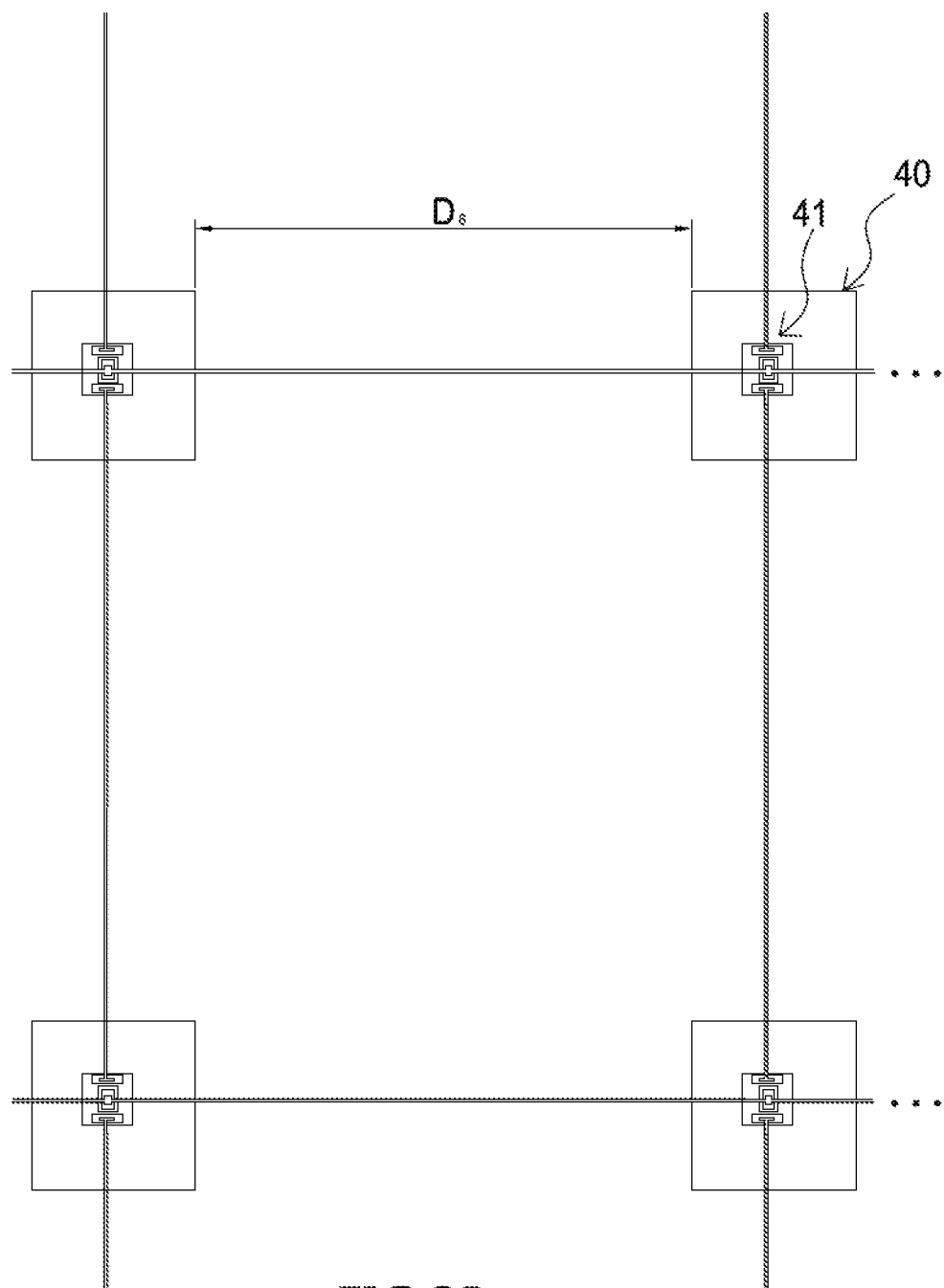
FIG. 2B shows a top view of the light-emitting array of FIG. 2A in a stretched state.

FIG. 2B shows a top view of the light-emitting array of the second embodiment in a stretched state. Compared with FIG. 1A, since the length of the stretchable segment 232 is increased to be the un-stretched state, two adjacent light-emitting elements 40 can be separated by a longer distance (D6) in the X direction (for example, D6 is larger than D2 depicted in FIG. 1D), in the Y direction, or in both direction after stretching. FIG. 2C shows a cross-sectional view taken along U-U' line in FIG. 2A, and FIG. 2D shows a cross-sectional view taken along V-V' line in FIG. 2A. As the same as shown in FIG. 1B and FIG. 1C, the trenches 111, 112 are formed on opposite side of the substrate 11; but there is no scarified layer 24 formed between the substrate 11 and the conductive line 23.

Figure 3A:
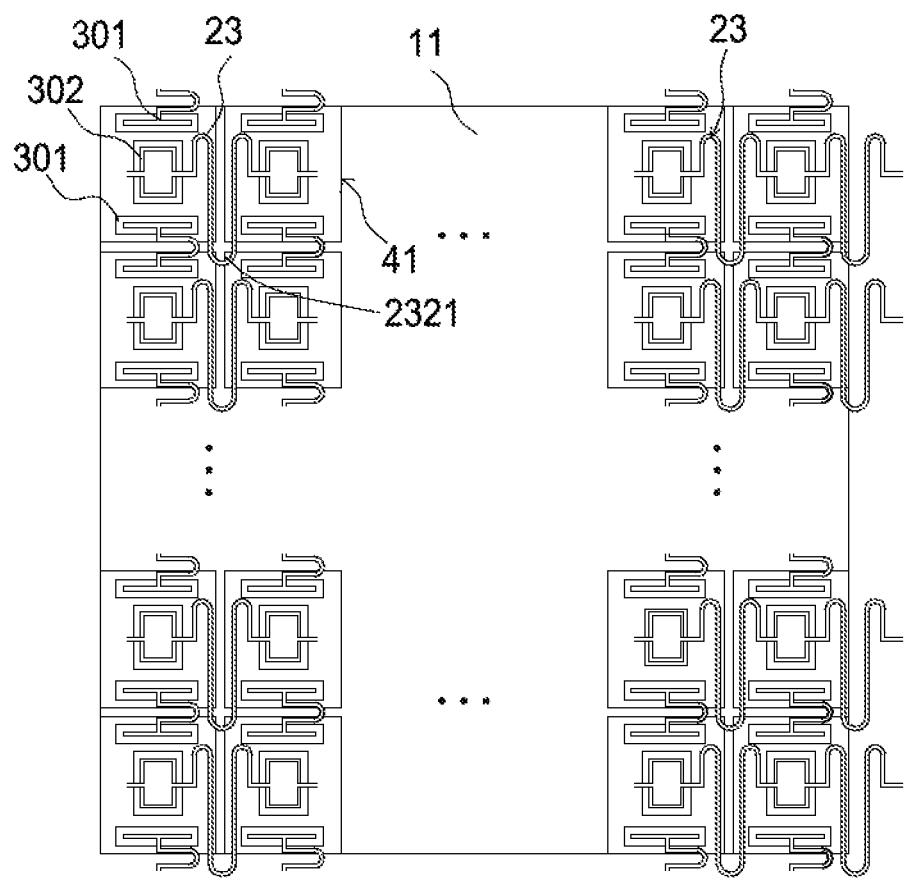
FIG. 3A shows a top view of a light-emitting array in an un-stretched state in accordance with another embodiment of the present invention.

FIG. 3A shows a top view of a light-emitting array in an un-stretched state in accordance with a third embodiment of the present invention. The light-emitting array of the third embodiment has a structure similar to that illustrated in the first embodiment. In this embodiment, the stretchable segment 232 connected between two light-emitting chips 41 has a portion 2321 extending above another light-emitting chip 41 which is not physically connected to the stretchable segment 232.

Figure 3B:
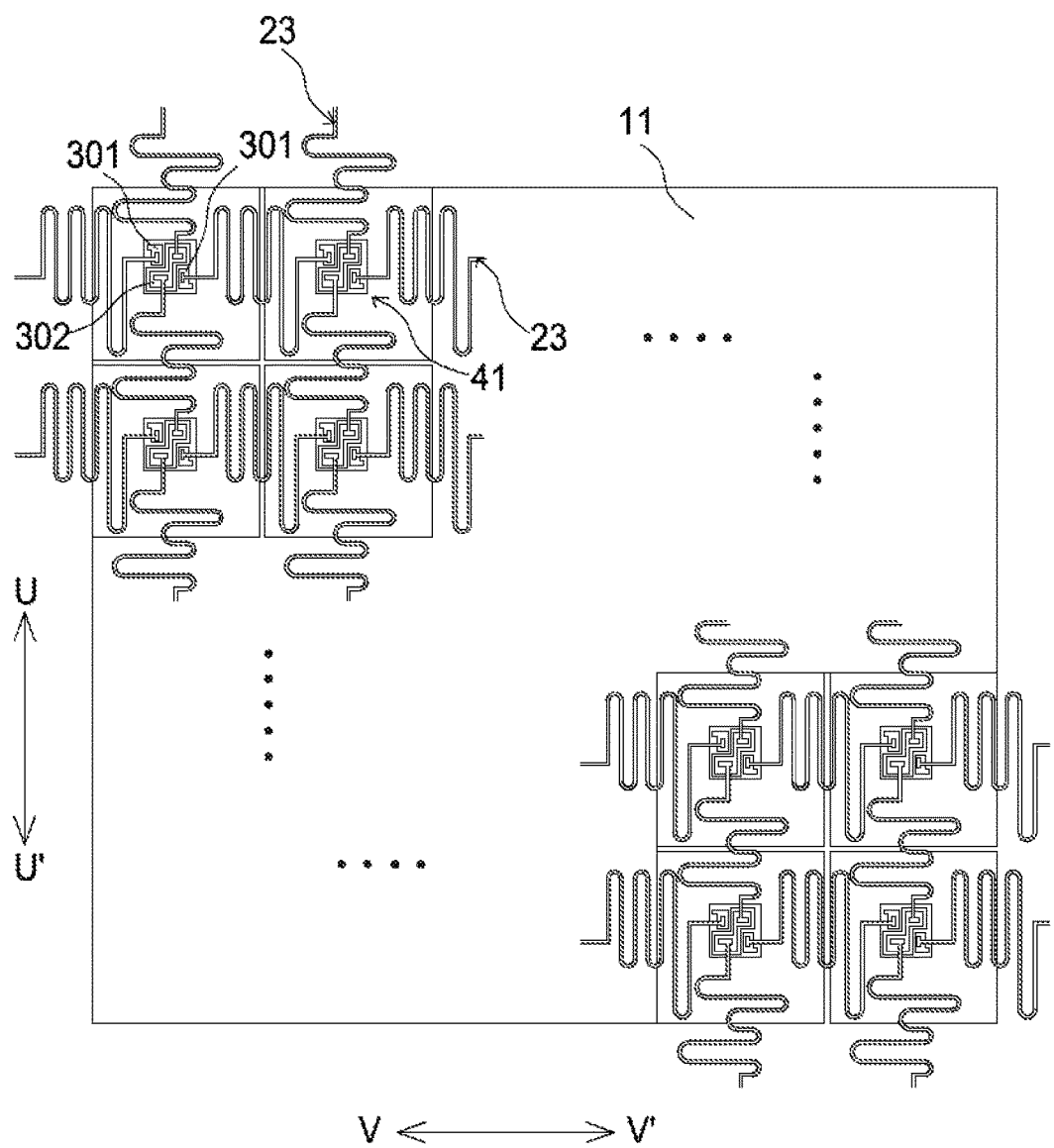
FIG. 3B shows a top view of a light-emitting array in an un-stretched state in accordance with an embodiment of the present invention.

FIG. 3B shows a top view of a light-emitting array in an un-stretched state in accordance with a fourth embodiment of the present invention. The light-emitting array of the fourth embodiment has a structure similar to that illustrated in the second embodiment. The light-emitting chip 41 has a rectangular shape and four corners, and the pads of the light-emitting chip 41 are formed on the four corners respectively. The two first pads 301 are arranged on diagonal corners (a first corner and a second corner). The second pad 302 is arranged to extend from a third corner to a fourth corner. In this embodiment, the second pad 302 is connected to the conductive lines 23 to provide electrical connection in a direction along the U-U' line, and the first pads 301 are connected to the conductive lines 23 to provide electrical connection in a direction along the V-V' line.

Figure 3C:
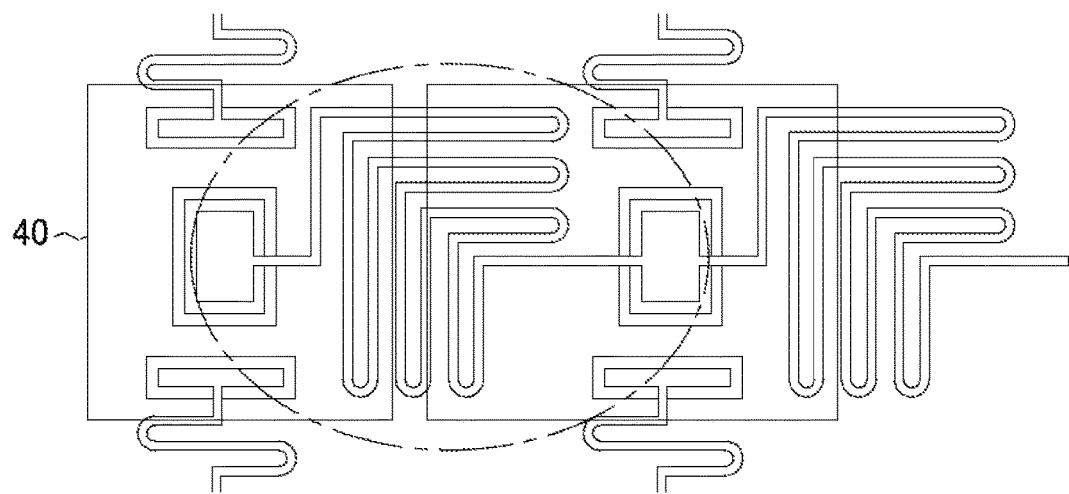
FIGS. 3C-3G show conductive line in accordance with embodiments of the present application.
Figure 3D:
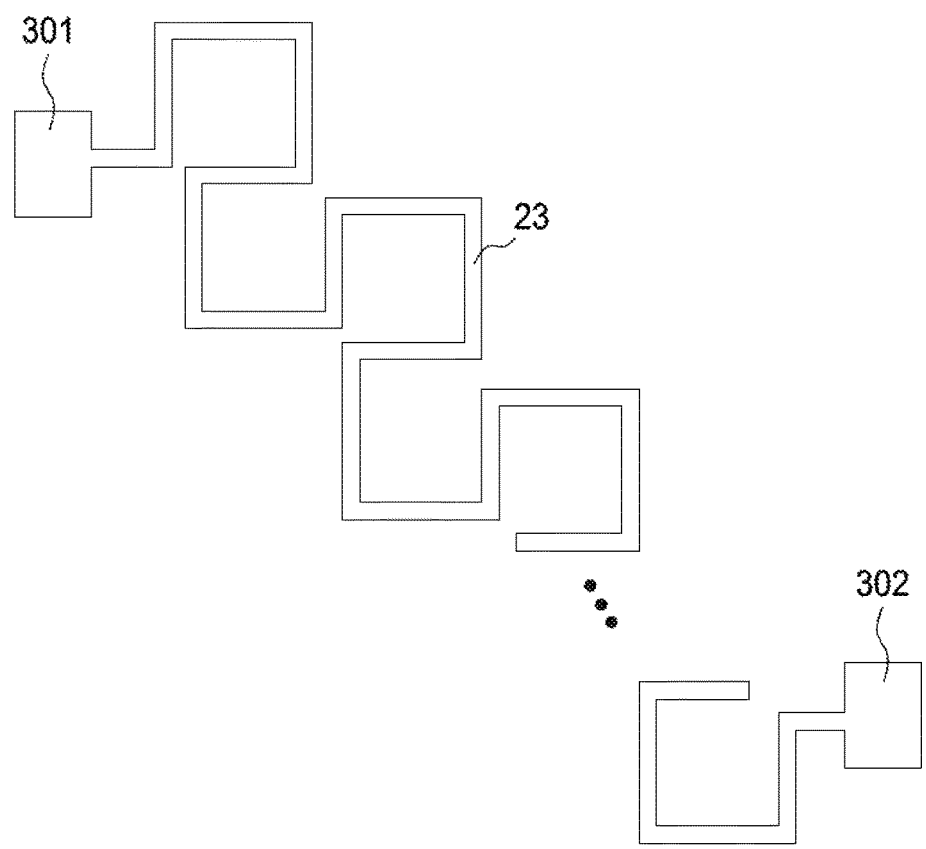

According to the embodiments shown in FIGS. 3A~3B, the conductive line 23 can be formed in various shape for different application. In addition, the distance between two adjacent LED units can be modified by adopting proper conductive line. For example, the line part can be a zig-zag type, a repeated "S-shaped" type, or a spiral type, etc. As a result, the space between two adjacent pads of different light-emitting elements 40 is more effectively utilized to dispose the conductive wire therein. FIGS. 3C~3D show two embodiments in accordance with the present application. FIG. 3C is an enlarged view of two adjacent light-emitting elements 40 and the conductive line 23 between them. The conductive line 23 is curved as a repeated "F-shaped" or repeated "7-shaped" as shown in FIG. 3C. Specifically, the conductive line 23 includes multiple stretchable segments 232, straight portions 233 between stretchable segments, and bending portions 234. The repeated "F-shaped" or repeated "7-shaped" of the conductive line 23 is formed by a repeated sequence of a bending portion 234, a straight portion 233, a stretchable segments 232, a straight portion 233, and another bending portion 234. Such that, the conductive line 23 includes multiple combinations of "bending portions 234—straight portion 233—stretchable segments 232—straight portion 233—bending portions 234" arranged to be perpendicular to each other. As a result, the space between two adjacent pads of different LED cells is more effectively utilized to dispose the conductive wire therein. In another embodiment, the combinations can be arranged alternately. Referring to FIG. 3D, the conductive line 23 is curved as a repeated "8-shape".

Figure 3E:
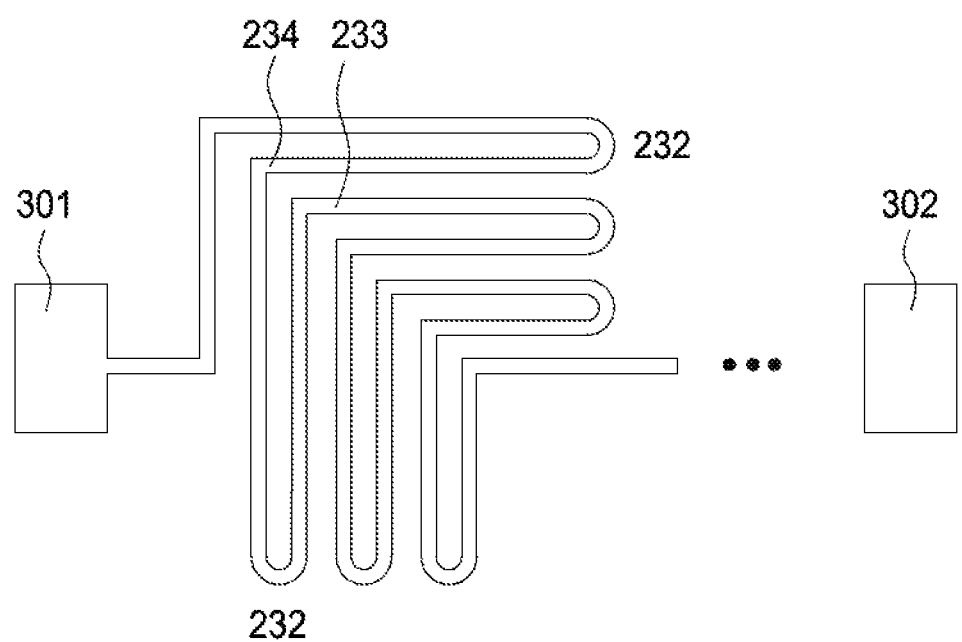
Figure 3F:
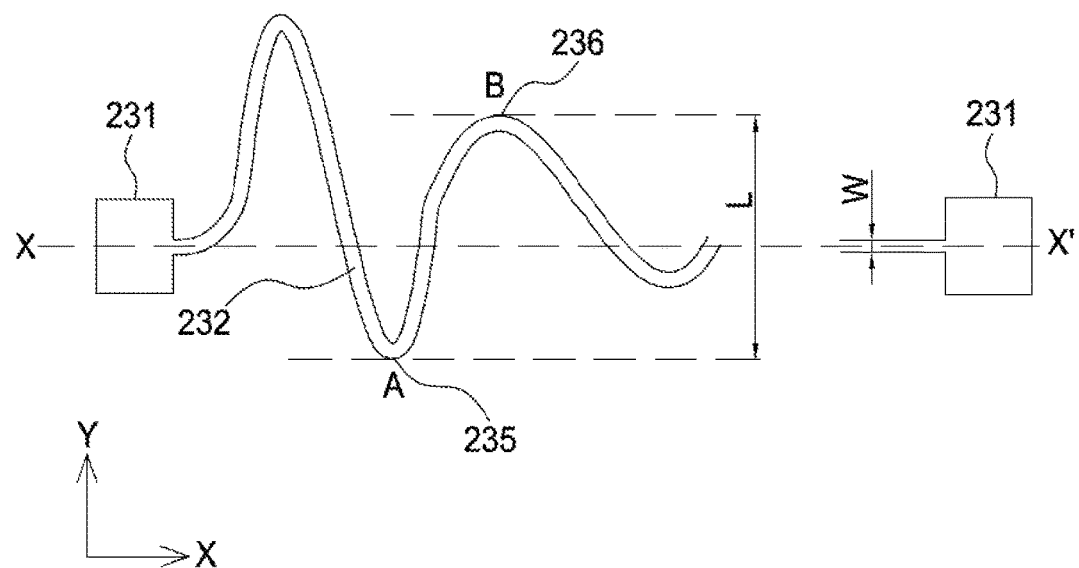
Figure 3G:
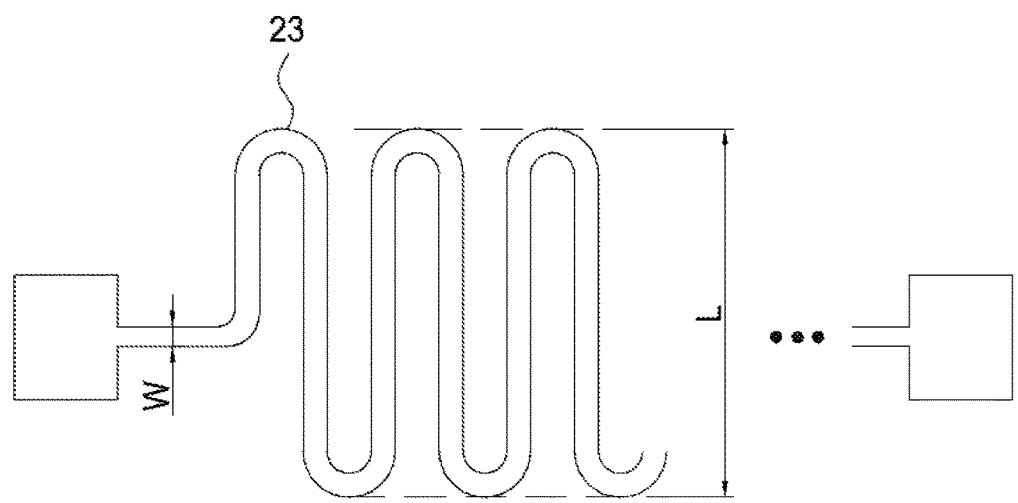

In addition, the conductive lines 23 are extended by external force, so the conductive wires should be strengthened to prevent broken caused by the external force. FIG. 3E is a top view of the conductive line 23 before being extended. In order to enhance the connecting strength between the connecting segments 231 and the stretchable segment 232, the contact area of the connecting segments 231 and the pad is increased. The width of the connecting segment 231 is larger than the width of the stretchable segments 232. The pattern of the connecting segment 231 can be a dot, a square, or a similar shape with the pads of a light-emitting chip, etc. As shown in FIG. 3E, the stretchable segments 232 of the conductive line 23 includes a first bending portion A and a second bending portion B. The curvature radius of the first bending portion A and the second bending portion B are represented as $R_A$ and $R_B$, respectively. W is the width of the stretchable segments 232. The dotted line X-X' is the direction along two connecting segments 231. L is the distance between the vertex 235 of bending portion A and the vertex 236 of bending portion B on a projecting direction which is perpendicular to line X-X', wherein L is larger than the sum of curvature radius $R_A$ and curvature radius $R_B$. Besides, the ratio of W to L (i.e. W/L) is varied within a range of 0.1 and 0.4, such as 0.2, 0.15, 0.3 and 0.38. In another embodiment, the ratio (W/L) can be less than 0.1 or larger than 0.4 for different application and different material of the conductive line applied. In this embodiment, the value of W/L is limited within the range, and the LED array will not be difficult to extend and the conductive line 23 will not be cracked easily when external force applied. Referring to FIG. 3F, an embodiment of the conductive line 23 with a repeated regular S-shape is shown. The curvature radius of each vertex is substantially the same, and the vertical distance L between two vertexes on opposite site of the conductive line 23 substantially remains a constant. The value of W/L also satisfies the criteria described above.

However, though the ratio between the width W of stretchable segments 232 and distance L between the vertex 235 of bending portion A and the vertex 236 is concerned, some modification is added for better reliability. Referring to FIG. 1A, the electrical connection between light-emitting chips 41 in X direction is provided by a conductive line 23 B1-Bn continuously extended in X direction. The electrical connection between light-emitting chips 41 in Y direction is provided by conductive lines 23 A1-An which are discontinuously extended in Y direction. In the embodiment shown in FIG. 1A, the connection strength in X direction is larger than the strength in Y direction because each of the area of pad 231 connecting to the second pad 302 is larger than the area of pad 231 connecting to the first pad 301. So, the area of pad 231 connecting to the first pad 301 is expected to be large than the area of pad 231 connecting to the second pad 302 for better connection strength in Y direction. In another embodiment, the area of the pad 231 connecting to the first pad 301 is 1~1.6 times the area of the pad 231 connecting to the second pad 302.

Figure 4A:
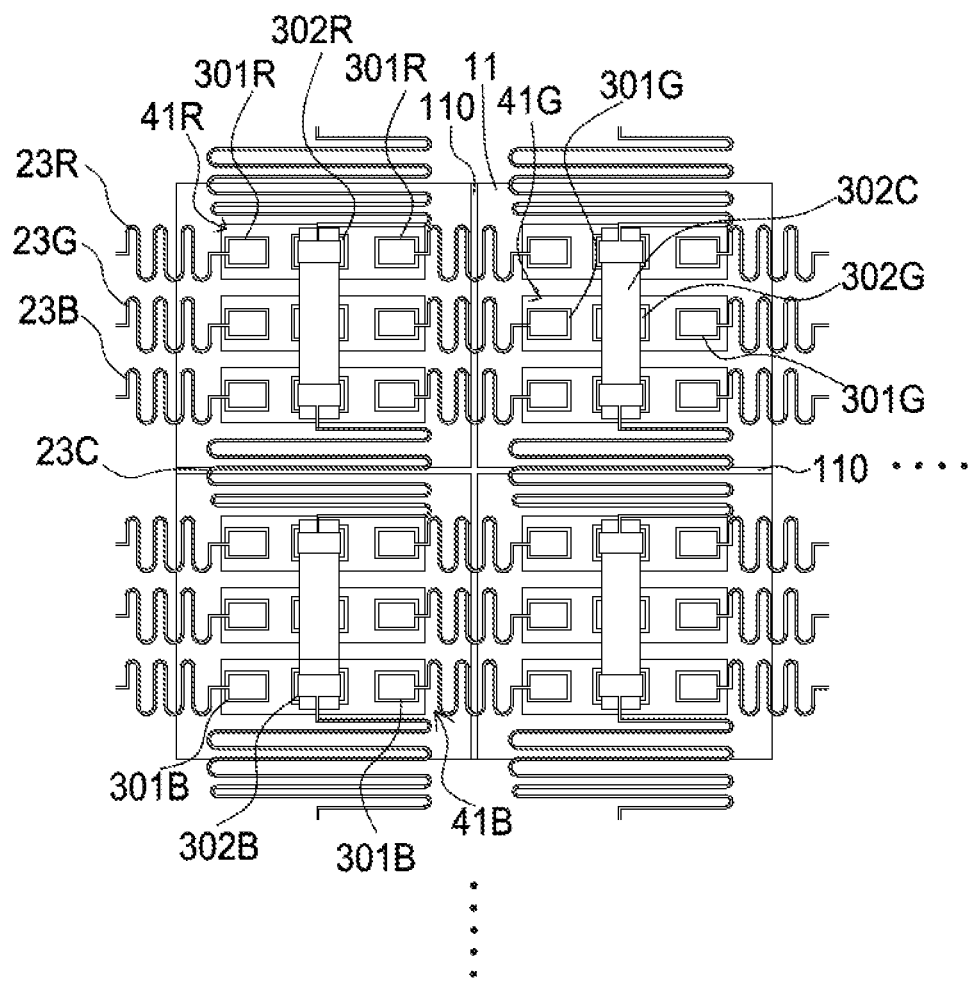
FIG. 4A shows a top view of a light-emitting array in an un-stretched state in accordance with another embodiment of the present invention.

FIG. 4A shows a top view of a light-emitting array in an un-stretched state in accordance with an embodiment of the present invention. The light-emitting array includes a plurality of light-emitting groups on a substrate 11. Each of the light-emitting groups includes a red light-emitting chip 41R, a green light-emitting chip 41G, and a blue light-emitting chip 41B. The red light-emitting chip 41R has two first pads 301R and a second pad 302R, and the substrate 11 includes scribing lines 110 between two of the light-emitting groups. One of the first pads 301R of the red light-emitting chip 41R is electrically connected to another first pad 301R of adjacent red light-emitting chip 41R by the conductive line 23R. Likewise, the green light-emitting chip 41G has two first pads 301G and a second pad 302G. One of the first pads 301G of the green light-emitting chip 41G is electrically connected to another first pad 301G of an adjacent green light-emitting chip 41G by the conductive line 23G. The blue light-emitting chip 41B has two first pads 301B and a second pad 302B. One of the first pads 301B of the blue light-emitting chip 41B is electrically connected to another first pad 301B of an adjacent blue light-emitting chip 41B by the conductive line 23B. A common pad 302C is formed on and to connect to the second pads 302R, 302G and 302B in one light-emitting group. The conductive line 23C is formed to connect the common pad 302C of a light-emitting group with the common pad 302C of an adjacent light-emitting group. As described in FIG. 1A, by selectively connecting the conductive line (23R, 23G, 23B, 23C) with the external element. The specific light-emitting chip (41R, 41G, or 41B) can emit light. In this embodiment, the light-emitting chips (41R, 41G, and 41B) are epitaxially grown on the substrate 11. The red light-emitting chip 41R can be optionally formed by using a red phosphor on a blue or UV light-emitting chip to emit a red light with a wavelength of 610-650 nm; and the green light-emitting chip 41G can be optionally formed by using a green phosphor on a blue or UV light-emitting chip to emit a green light with a wavelength of 530-570 nm. The blue light-emitting chip 41B can be optionally formed by using a blue phosphor on a UV light-emitting chip to emit a blue light with a wavelength of 450-490 nm. Each of the light-emitting group can be used as a pixel in a display or a backlight in a display. In this embodiment, one light-emitting group has three red light-emitting chips 41R, three green light-emitting chips 41G, and three blue light-emitting chips 41B. In another embodiment, one light-emitting group includes one light-emitting chip or two light-emitting chips of different colors.

Figure 4B:
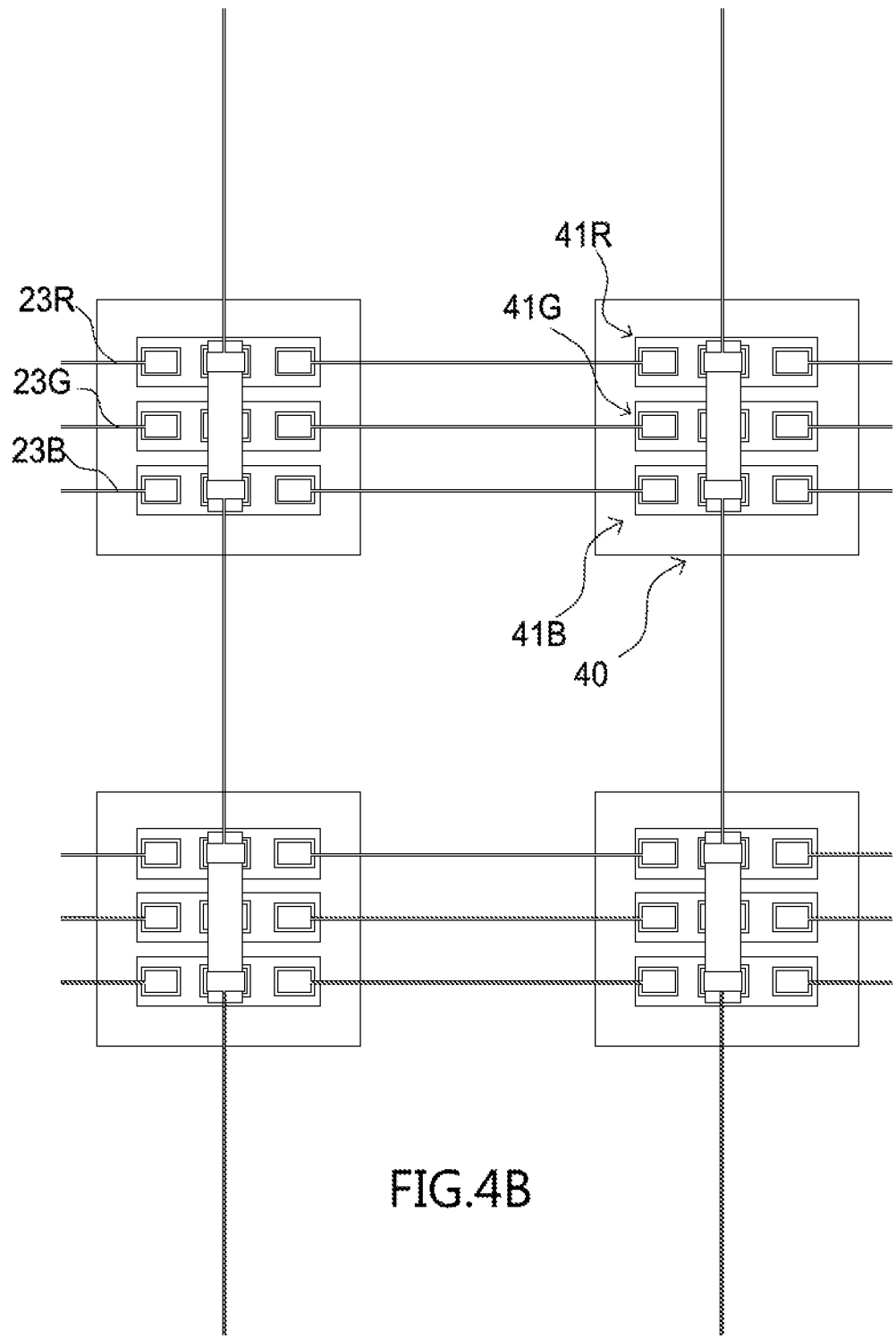
FIG. 4B shows a top view of the light-emitting array in a stretched state.
Figure 4C:
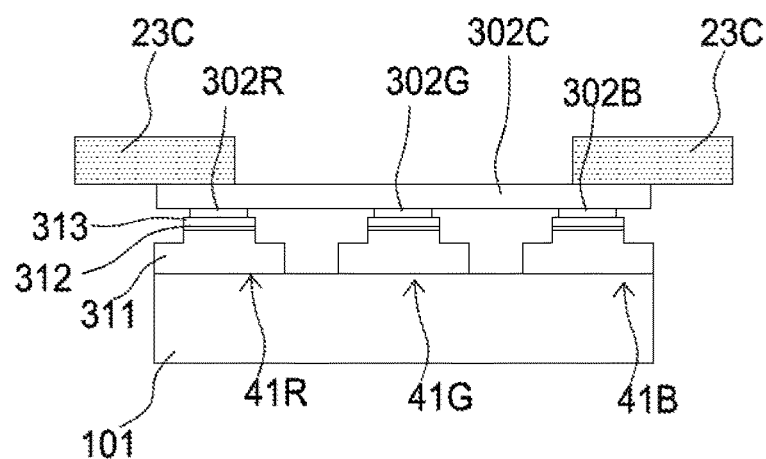
FIG. 4C shows cross-sectional views of an LED array shown in FIG. 4A.

FIG. 4B shows a top view of the light-emitting array of an embodiment in a stretched state. FIG. 4C shows a cross-sectional view of an embodiment shown in FIG. 4A. Before stretching, the light-emitting groups are separated from each other. The separated light-emitting groups are formed on the substrate 11. The substrate 11 is separated into several pieces as common substrates. Referring to FIG. 4C, the light-emitting chips 41R, 41G, and 41B of one light-emitting group are formed on one common substrate 101, and the light-emitting group on one common substrate 101 is connected to another light-emitting group on another common substrate 101.

Figure 4D:
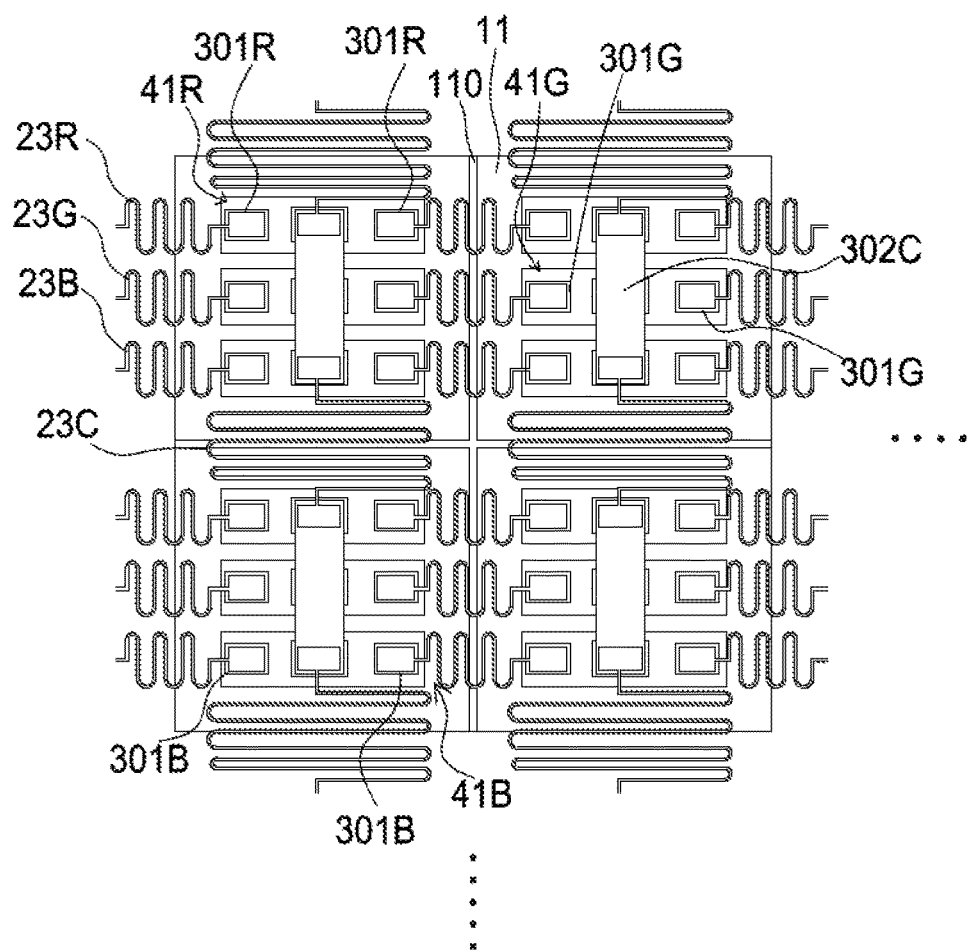
FIG. 4D shows a top view of a light-emitting array in an un-stretched state in accordance with further embodiment of the present invention.
Figure 4E:
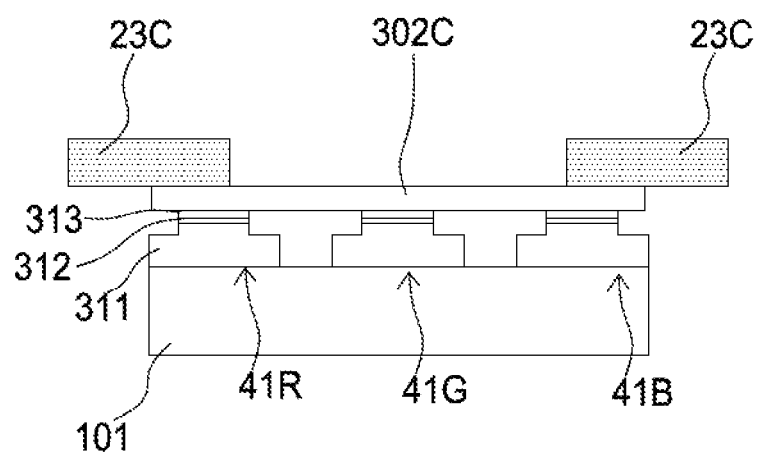
FIG. 4E shows a cross-sectional view of a light-emitting group in accordance with an embodiment of the present invention.

FIG. 4D shows a top view of a light-emitting array in an un-stretched state in accordance with a further embodiment of the present invention. FIG. 4E shows a cross-sectional view of a light-emitting group in accordance with an embodiment of the present invention. The light-emitting array of the sixth embodiment has a structure similar to that illustrating in FIG. 4A. Referring to FIG. 4D, the common pad 302C is formed on the light-emitting group. Referring to FIG. 4E, the common pad 302C is directly formed on the semiconductor layers 313 of the light-emitting chips 41R, 41G, and 41B without second pads formed therebetween. Referring to FIG. 4C, the second pads 302R, 302G and 302B of the light-emitting chips 41R, 41G, 41B are formed between the semiconductor layers 313 and the common pad 302C.

Figure 5A:
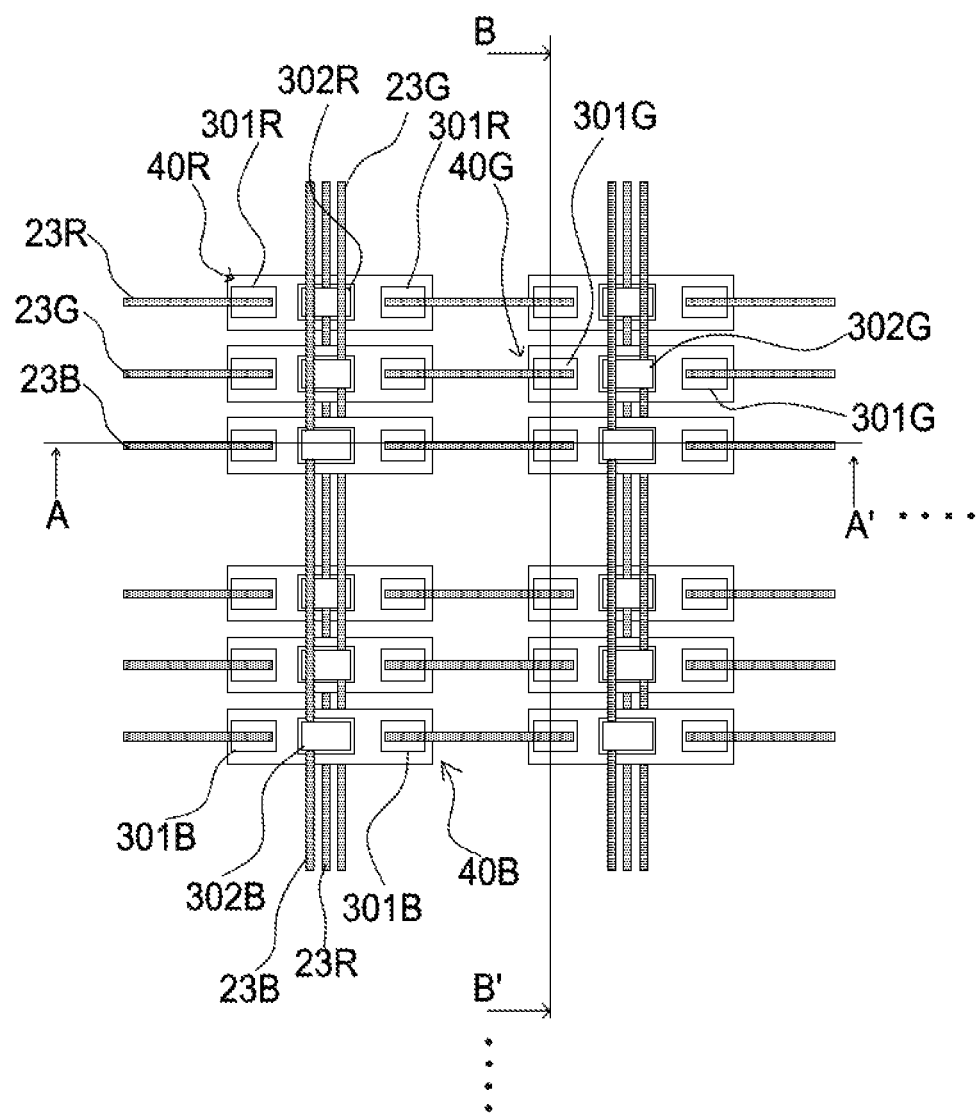
FIG. 5A shows a top view in an un-stretched state in accordance with a more embodiment of the present invention.

FIG. 5A shows a top view in an un-stretched state in accordance with an embodiment of the present invention. There are three light-emitting arrays including a red light-emitting array, a green light-emitting array, and a blue light-emitting array. Each light-emitting array can have a structure as shown in FIG. 1A, 2A, or 3A. Specifically, the red light-emitting array includes a plurality of red light-emitting elements 40R, the green light-emitting array includes a plurality of the green light-emitting elements 40G, and the blue light-emitting array includes a plurality of the blue light-emitting elements 40B. Two adjacent red light-emitting elements 40R are electrically connected to each other by the conductive line 23R, two adjacent green light-emitting elements 40G are electrically connected to each other by the conductive line 23G, and two adjacent blue light-emitting elements 40B are electrically connected to each other by the conductive line 23B. The three light-emitting arrays are spatially arranged such that the conductive lines 23R, 23G, 23B do not penetrate each other. In other words, the light-emitting elements 40R, 40G and 40B are arranged in different elevations (see FIG. 5C). In addition, the three light-emitting arrays are alternately arranged such that, in a top view, the light-emitting elements 40R, 40G and 40B are formed in a repeated configuration of blue-green-red pattern in a two dimensional plane. One blue-green-red pattern is used as a pixel in a display. A transparent material, such as silicone, epoxy, polyimide (PI), BCB, perfluorocyclobutane (PFCB), Su8, acrylic resin, polymethyl methacrylate (PMMA), polyethylene terephthalate (PET), polycarbonate (PC), polyetherimide, or fluorocarbon polymer, can be filled among the three light-emitting arrays.

Figure 5B:
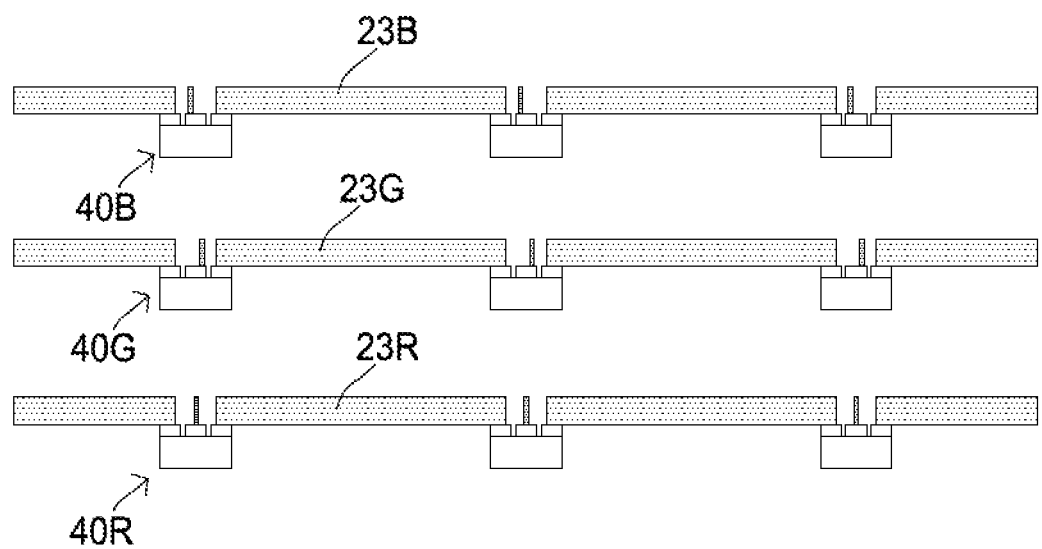
FIG. 5B shows a cross-sectional view along the line A-A' in FIG. 5A.
Figure 5C:
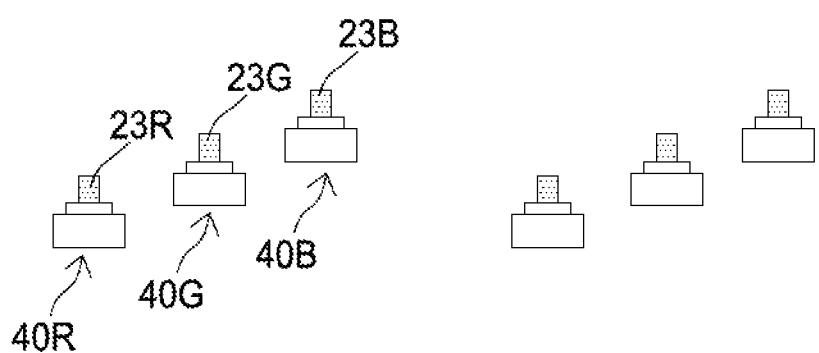
FIG. 5C shows a cross-sectional view taken along the line B-B' in FIG. 5A.

FIG. 5B shows a cross-sectional view along the line A-A' in FIG. 5A. The red light-emitting element 40R can have an active layer made of $Al_xIn_yGa(131\ x-y)P$, wherein $0 \le x$, $y \le 1$; $(x+y) \le 1$, to emit a red light with a wavelength of 610-650 nm; the green light-emitting element 40G can have an active layer made of $Al_xIn_yGa(1-x-y)N$, wherein $0 \le x$, $y \le 1$; $(x+y) \le 1$, to emit a green light with a wavelength of 530-570 nm; and the blue light-emitting element 40B can have an active layer made of $Al_xIn_yGa(1-x-y)N$, wherein $0 \le x$, $y \le 1$; $(x+y) \le 1$, to emit a blue light with a wavelength of 450-490 nm. Moreover, a frame (not shown) is provided to interpose between any two of the light-emitting elements to avoid a light absorption or cross talk therebetween. FIG. 5C shows a cross-sectional view taken along the line B-B' in FIG. 5A. The light-emitting elements 40R, 40G and 40B are arranged in different elevations. The light-emitting element 40B is arranged at an elevation higher than the light-emitting element 40G, and the light-emitting element 40G is arranged at an elevation higher than the light-emitting element 40R.

Figure 5D:
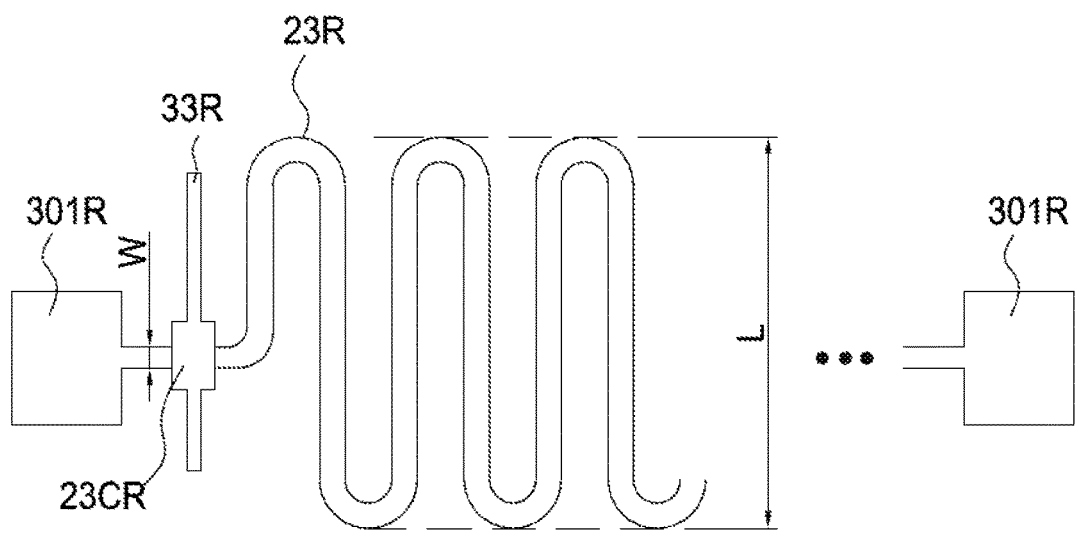
FIGS. 5D-5H show control element in accordance with an embodiment of the present application.
Figure 5E:
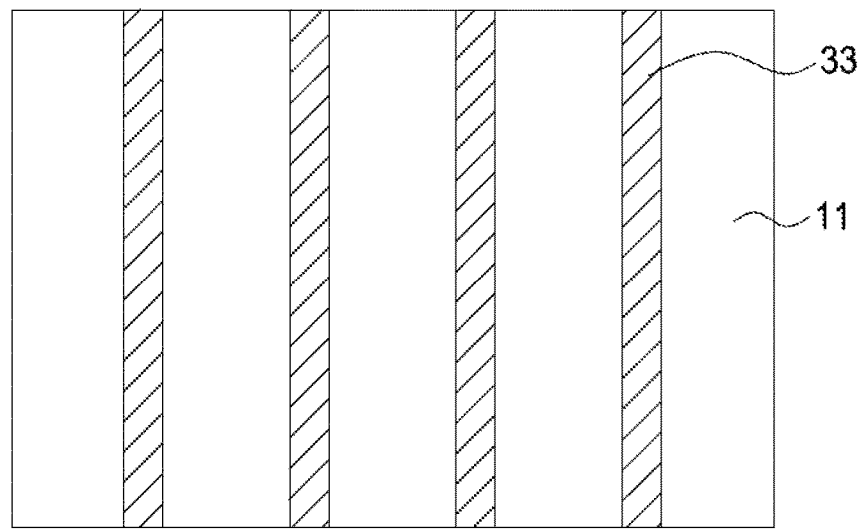
Figure 5E:
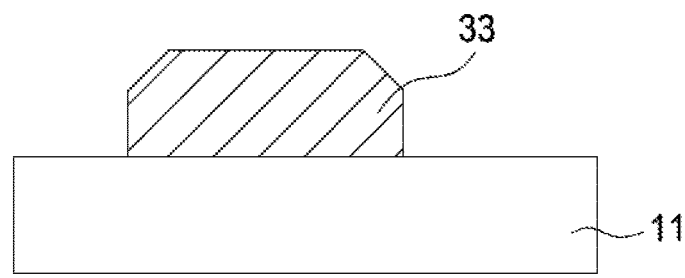
Figure 5F:
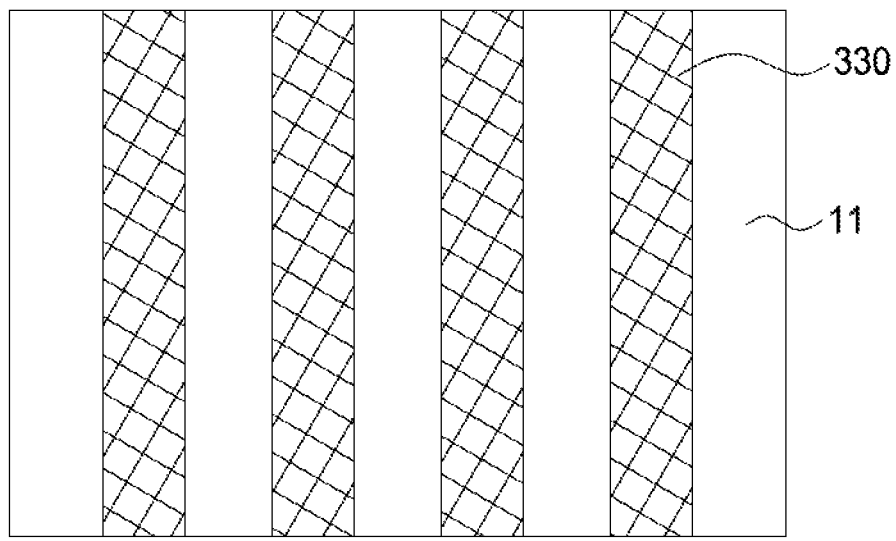
Figure 5F:
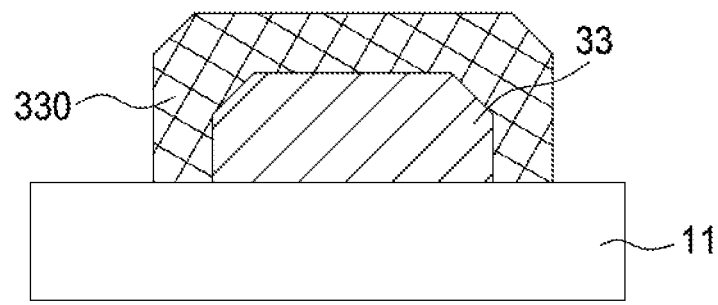
Figure 5G:
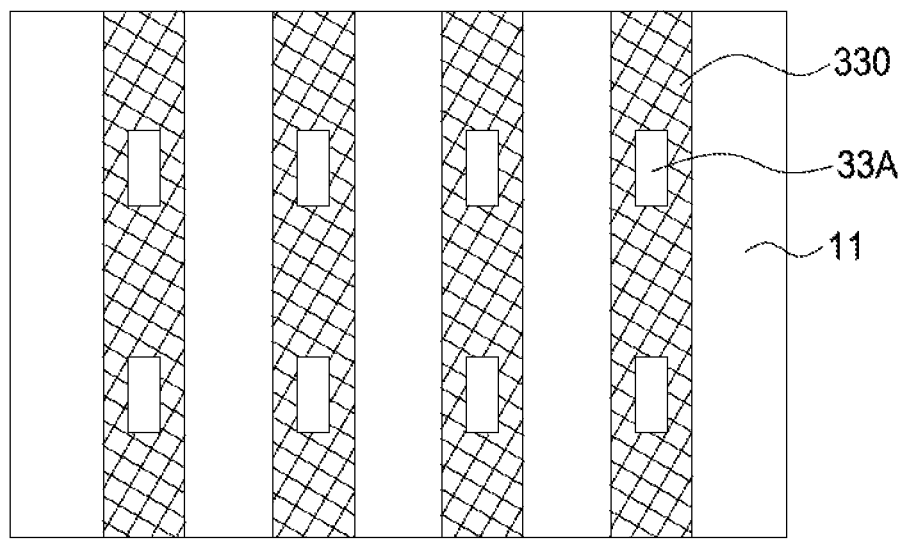
Figure 5G:
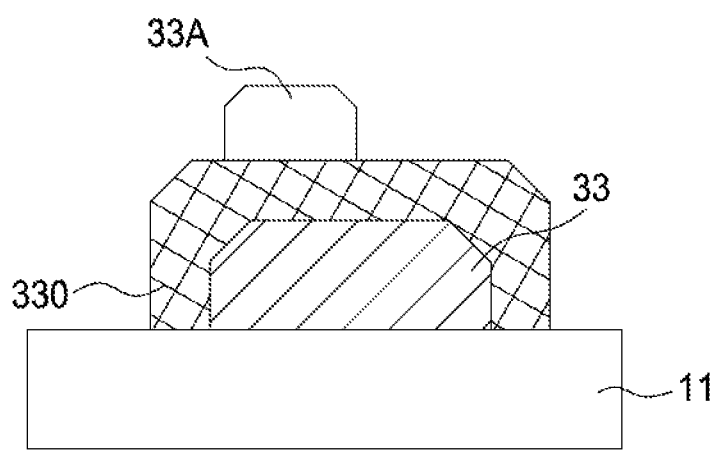
Figure 5H:
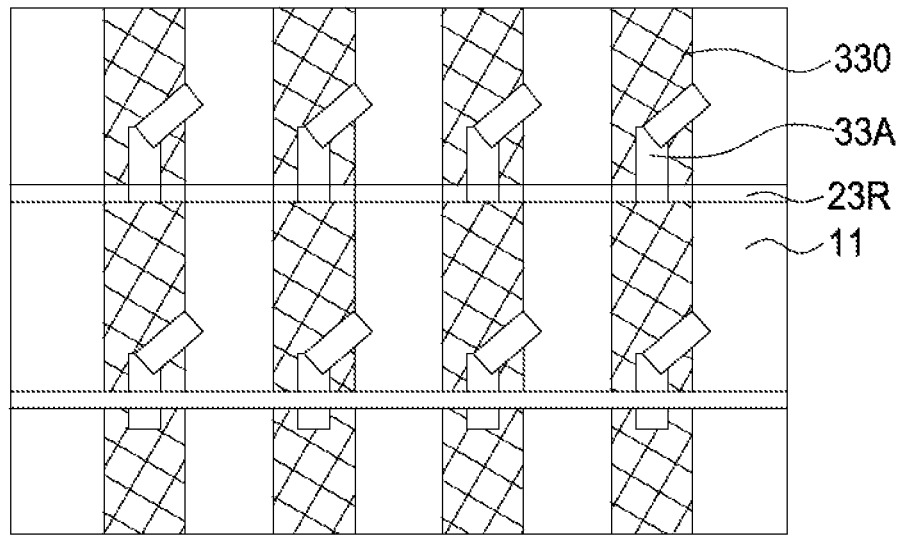
Figure 5H:
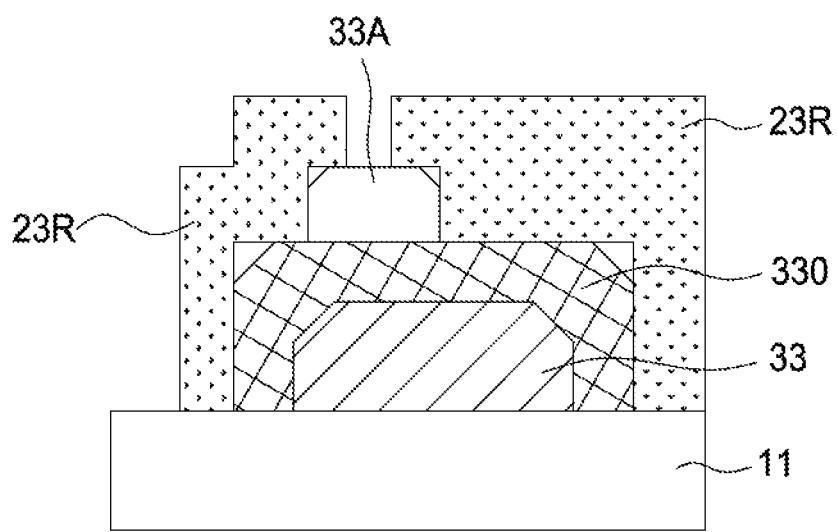

In addition, a control element can be added to the embodiment shown in FIG. 5A to control each of the light-emitting elements. FIGS. 5D-5H show an embodiment of a control element in accordance with present application. Referring to FIG. 5D, a control element 23CR is connected to the conductive lines 23R, and a control line 33R is connected to the control element 23CR. The light-emitting element 40R is designed to be electrically powered by the conductive lines 23R shown FIG. 5A. Then, the control element 23CR, such as a transistor, is added to control the light-emitting element 40R shown in FIG. 5D. In this embodiment, the control line 33R is served as the gate of the control element 23CR and the conductive line 23R is served as the drain and source of the control element 23CR. The control element 23CR is turned on while a control signal is provided to the control element 23R through the control line 33R. Thus, the control line 33R is controlled to be at a high level, and the current from the pad 301R is transmitted to the light-emitting element 40R through the conductive line 23R. FIGS. 5E~5H show the top views and cross-sectional views of the process of manufacturing the control element 23CR in accordance with an embodiment of the present invention. Referring to FIG. 5E, a conductive line 33, which can be connected to the control line 33R shown in FIG. 5D, is formed on the substrate 11. In another embodiment, the conductive line 33 and the control line 33R can be formed at once. Referring to FIG. 5F, a dielectric layer 330 is provided on the conductive line 33 to cover the top surface and the sidewalls of the conductive line 33. Referring to FIGS. 5G~5H, the active layers 33A with a doped semiconductor layer is formed on the dielectric layer 330 to be connected to the conductive line 23R. The active layer 33A includes one or more doped layers of the same or different conductive types. Moreover, the doping concentrations of the doped layers can be the same or different. A similar structure of a control element 23CR can also be applied to control other light-emitting elements, such as light-emitting elements 40G and light-emitting elements 40B. Besides, the control element 23CR can be formed to connect the conductive line 23R along the line A-A' or formed along the line B-B'. One control element can be used to control one light-emitting element with a control signal provided through a control line as shown in previous embodiment. In anther embodiment, one control element can be used to control two or more light-emitting elements by providing one or more control signals. With the adoption of the control elements, the light-emitting array can be used as a display to show required pictures or images.

Figure 6A:
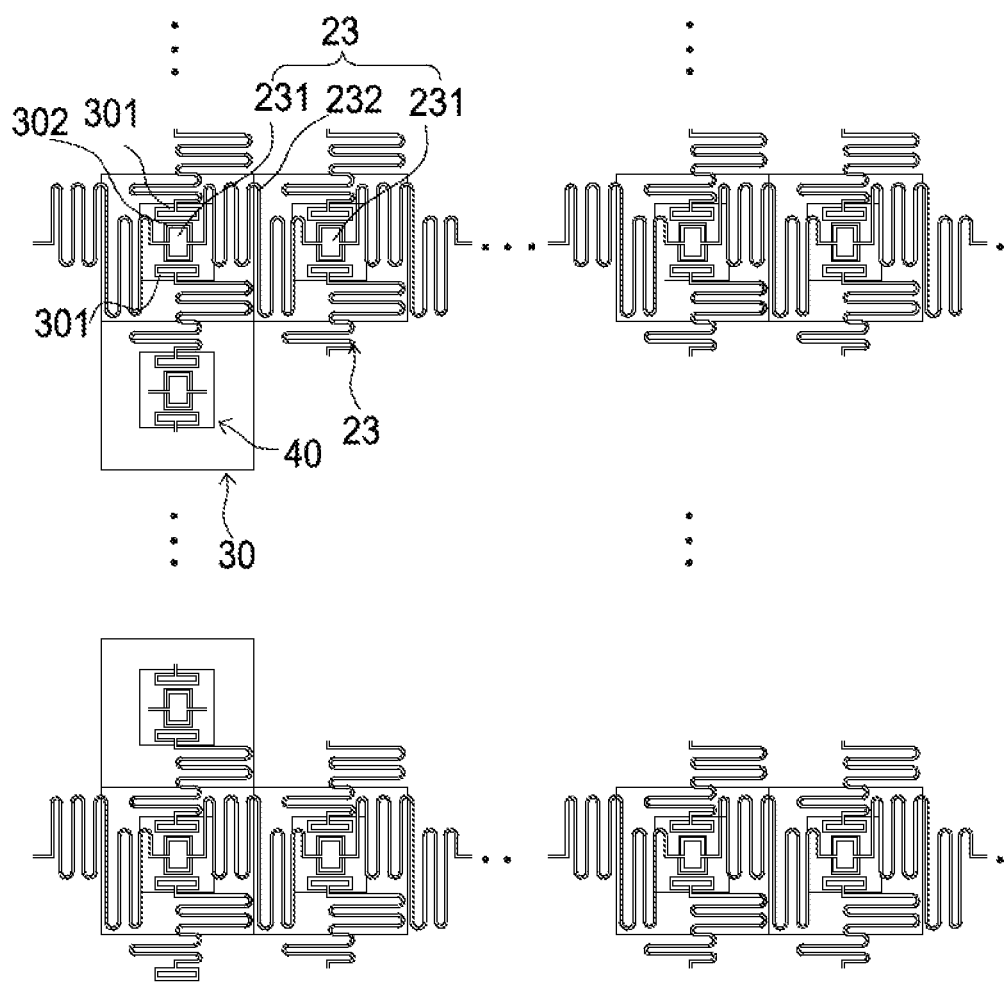
FIG. 6A shows a top view of a light-emitting array in an un-stretched state in accordance with an embodiment of the present invention.

FIG. 6A shows a top view of a light-emitting array in an un-stretched state in accordance with an embodiment of the present invention. The light-emitting array includes a plurality of light-emitting units 30. Each of the light-emitting units 30 has a light-emitting element 40. The structure of the light-emitting unit 30 is described below. The electrical connection between the light-emitting units 30 can be derived from the aforementioned teaching and therefore is omitted herein for brevity.

FIG. 6B shows a top view of a light-emitting array in an un-stretched state in accordance with an embodiment of the present invention. The light-emitting array is a 1-dimension array and includes a plurality of light-emitting units 30. Each of the light-emitting units 30 has a light-emitting element 40. The light-emitting element 40 has a first pad 301 and a second pad 302. The first pad 301 of one of the light-emitting elements 40 is connected to the second pad 302 of adjacent one of the light-emitting element 40 by the conductive line 23 such that the light-emitting elements 40 or the light-emitting units 30 are electrically connected to each other in series. The structure of the light-emitting unit 30 is described below. A detail of the conductive line 23 can be derived from the aforementioned teaching and therefore is omitted herein for brevity. The structure shown in FIGS. 5D~5H can be applied to embodiments shown in FIGS. 6A~6B. That is, the control element 23CR can be used to control light-emitting units 30 in the 2-dimensional light-emitting array as shown in FIG. 6A or in the 1-dimensional light-emitting array shown in FIG. 6B.

Figure 7A:
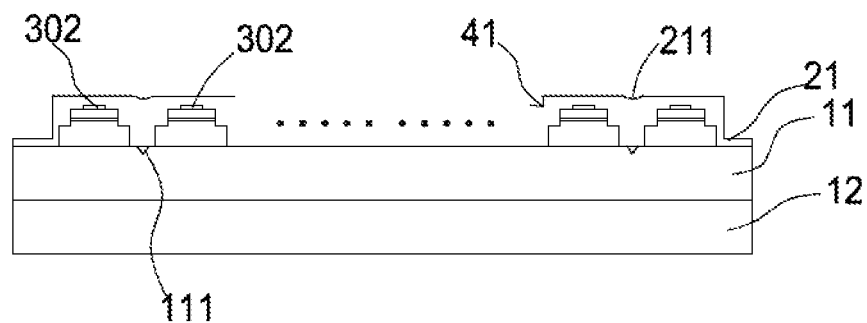
FIGS. 7A-7G show steps of making the light-emitting array of FIG. 1A.
Figure 7B:
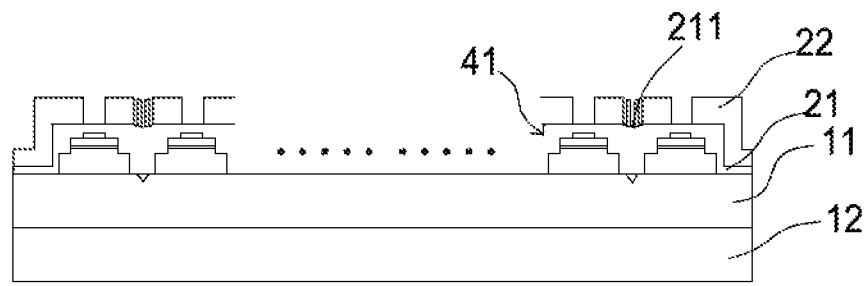
Figure 7C:
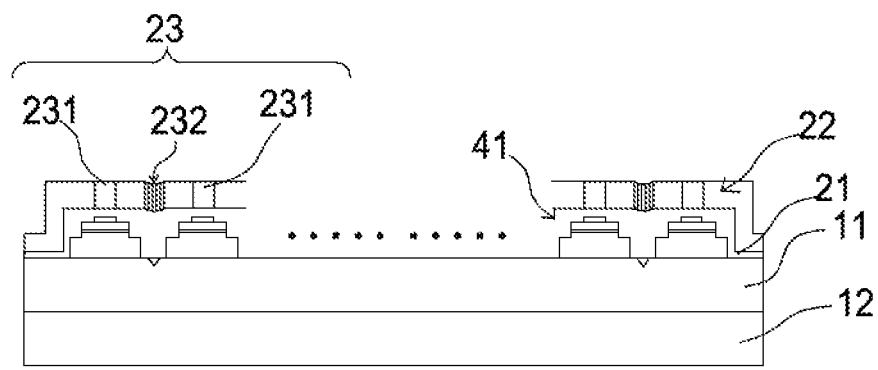
Figure 7D:
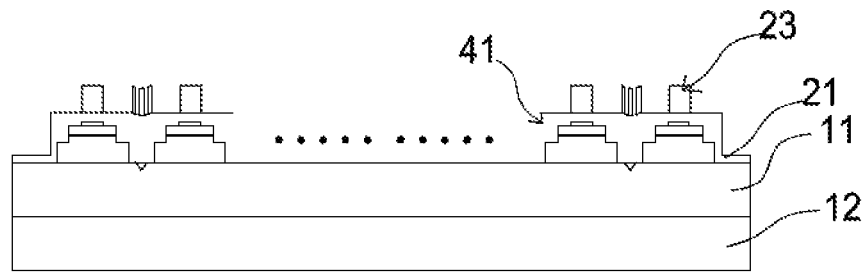
Figure 7E:
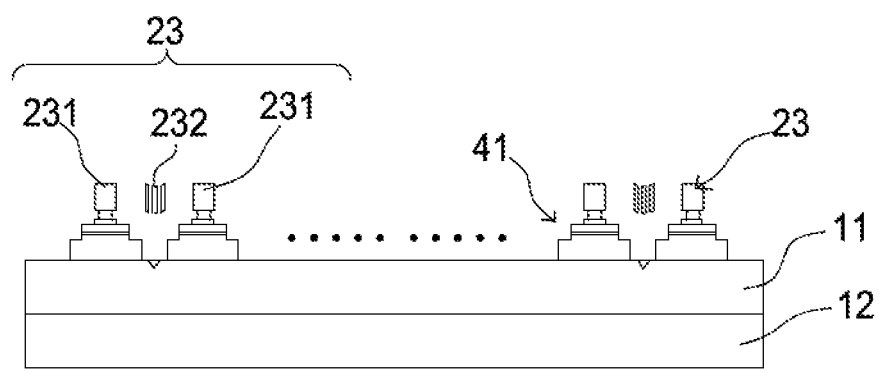
Figure 7F:
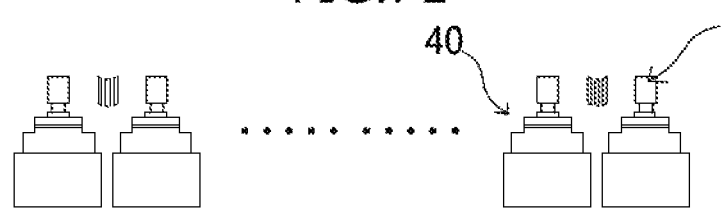

FIGS. 7A-7G illustrate steps of making the light-emitting array related to the first embodiment of the application. It is noted that FIGS. 7A-7G illustrate steps of making the conductive line 23 along the V-V' line, but the conductive line 23 along the U-U' line can be formed by the same making steps. As shown in FIG. 7A, a plurality of spaced-apart light-emitting chips 41 are located on a substrate 11. The substrate 11 is situated on a temporary substrate 12. Each second pad 302 of the light-emitting chips 41 is exposed. A seed layer 21 is fully formed on the light-emitting chips 41 and the substrate 11. A recess region 211 of the seed layer 21 locates at a position between two adjacent light-emitting chips 41. In this embodiment, the seed layer 21 is not fully filled in a space between two adjacent light-emitting chips 41 and therefore air may exist in the space. A trench 111 is formed on the substrate 11 at a position substantially corresponding to the recess region 211.

As shown in FIG. 7B, a patterned layer 22, such as a photoresistor layer, is formed on the seed layer 21 to expose the seed layer 21 at a position corresponding to the second pads 302 and to expose the seed layer 21 at portions corresponding to the recess region 211. As shown in FIG. 7C, a conductive line 23 is formed on the exposed seed layer 21 which is not covered by the patterned layer 22. The conductive line 23 has a connecting segment 231 formed on the second pad 302 of one light-emitting chip 41, another connecting segment 231 formed on the second pad 302 of adjacent one light-emitting chip 41, and a stretchable segment 232 located between the adjacent connecting segments 231. As shown in FIGS. 7D~7E, the patterned layer 22 and the seed layer 21 are sequentially removed. The area of the seed layer 21 below the connecting segment 231 is larger than that below the stretchable segment 232. The portion of the seed layer 21 below the stretchable segment 232 can be totally removed. The portion of the seed layer 21 below the connecting segment 231 is not fully removed and part of the portion below the connecting segment 231 is preserved. Therefore, the first segment 231 and the second segment 233 are still connected to the light-emitting chips 41, and the stretchable segment 232 is suspended.

Figure 7G:
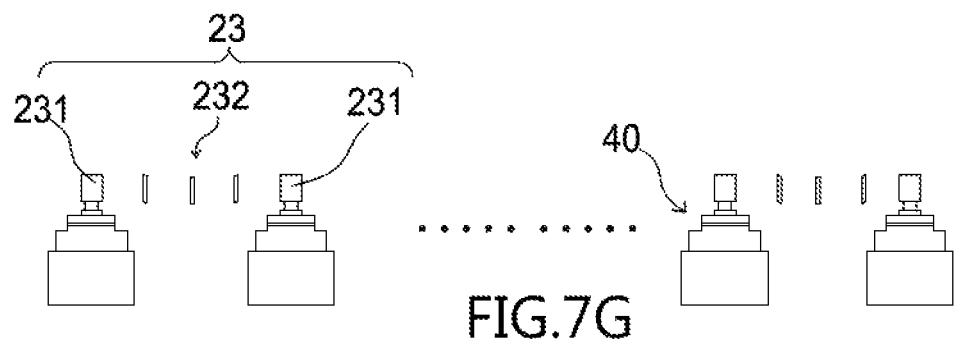

As shown in FIG. 7F, the temporary substrate 12 is removed and the substrate 11 is divided along the trench 111 to form a plurality of light-emitting elements 40. Then, the plurality of light-emitting elements 40 is stretched as shown in FIG. 1D and FIG. 7G. A force is applied to stretch the stretchable segment 232 and to enlarge a space between the light-emitting elements 40.

Figure 8A:
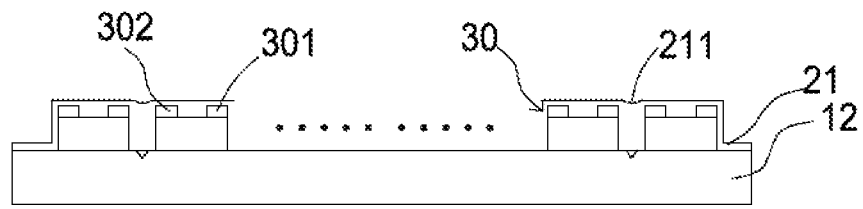
FIGS. 8A-8G show the manufacturing steps related to the embodiment of the application.
Figure 8B:
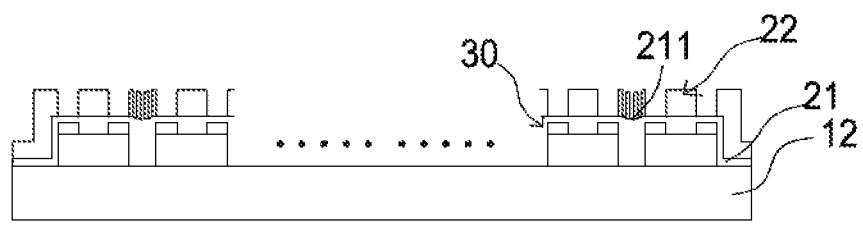

FIGS. 8A-8G show the manufacturing steps related to the embodiment shown in FIG. 6B, but the light-emitting units 30 are spaced apart from each other and are not arranged to abut against each other. As shown in FIG. 8A, a plurality of spaced-apart light-emitting units 30 are formed on a temporary substrate 12. The first pad 301 and the second pad 302 in each light-emitting unit 30 are exposed. A seed layer 21 is fully formed on the light-emitting units 30 and the temporary substrate 12. The seed layer 21 is located at a position between two adjacent light-emitting units 30 and has a recess region 211. In addition, the seed layer 21 cannot be fully filled in a space between two adjacent light-emitting units 30, and air may exist in the space. As shown in FIG. 8B, a patterned layer 22, such as a photoresistor layer, is formed on the seed layer 21 to expose the seed layer 21 at a position corresponding to the first pad 301 and the second pad 302, and to expose the seed layer 21 at portions corresponding to the recess region 211.

Figure 8C:
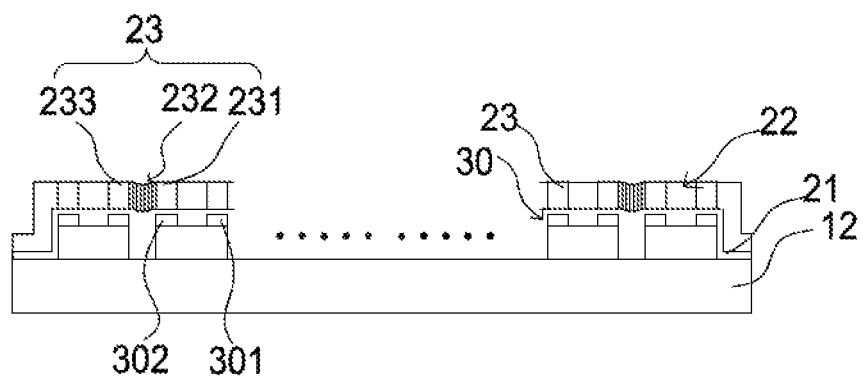

As shown in FIG. 8C, a conductive line 23 is formed on the exposed seed layer 21 which is not covered by the patterned layer 22. The conductive line 23 has a connecting segment 231 formed on the first pad 301 of one light-emitting chip, a connecting segment 233 formed on the second pad 302 of adjacent one light-emitting chip, and a stretchable segment 232 extended between the first segment 231 and the second segment 233.

Figure 8D:
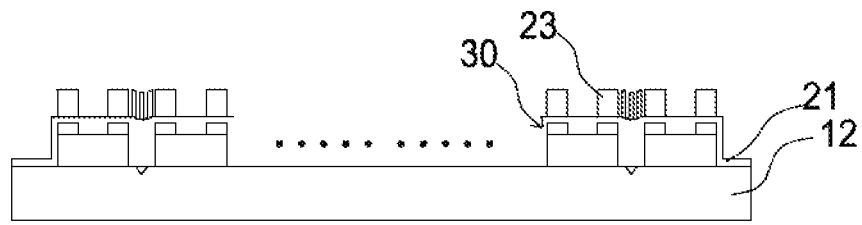
Figure 8E:
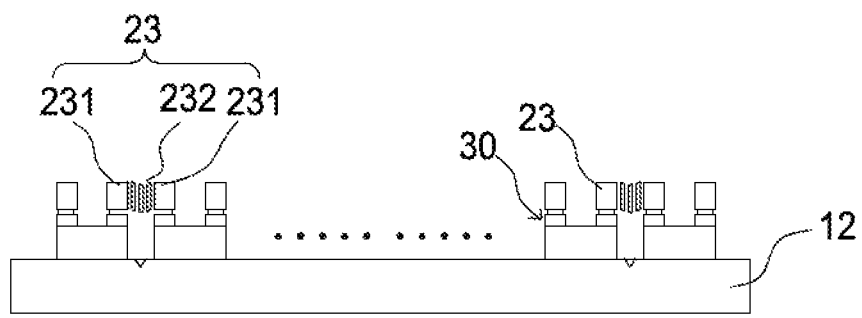

As shown in FIG. 8D~8E, the patterned layer 22 and the seed layer 21 are removed. The area of the seed layer 21 below the connecting segment 231 is larger than that below the stretchable segment 232. The portion of the seed layer 21 below the stretchable segment 232 can be totally removed, and the portion of the seed layer 21 below the connecting segment 231 are not fully removed and part of the portion below the connecting segment 231 is preserved. Therefore, the connecting segments 231 and the stretchable segment 232 are still connected to the light-emitting units 30, and the stretchable segment 232 is suspended.

Figure 8F:
Figure 8G:
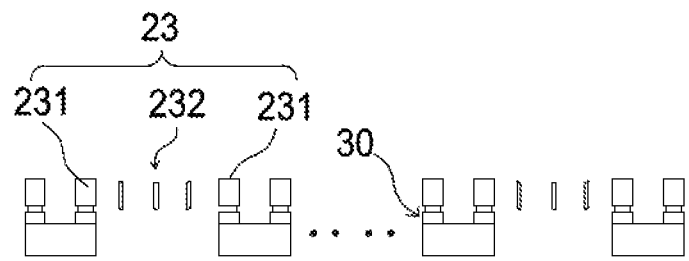

As shown in FIGS. 8F~8G, the temporary substrate 12 is removed, and a force is applied to stretch the stretchable segment 232 of the conductive line 23 and to enlarge a space between the light-emitting units 30. The process in FIGS. 7A-7G or FIGS. 8A-8G can be applied to aforementioned embodiments.

Figure 9A:
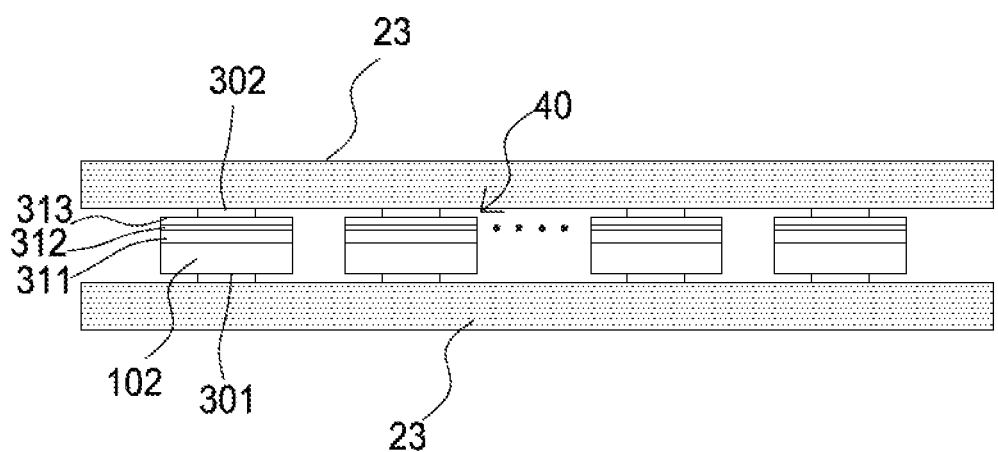
FIGS. 9A~9E show a cross-sectional view and manufacturing process in accordance with a further embodiment of the present invention.

It is noted that the light-emitting element in the aforementioned embodiments have the first pad 301 and the second pad 302 on the same side of the substrate which is defined herein as a horizontal-type light-emitting element. However, a vertical-type light-emitting element can be used. The vertical-type light-emitting element is defined herein that the first pad 301 and the second pad 302 are formed on the opposite sides of the substrate. FIG. 9A shows a cross-sectional view in accordance with an embodiment of the present invention where the vertical-type light-emitting element is illustrated. Each of the light-emitting elements 40 has a light-emitting stack which includes a first-type semiconductor layer 311, an active layer 312, and a second-type semiconductor layer 313. The first pad 301 is formed on the conductive substrate 102 (SiC, GaN, GaAs, TiW, or Cu). The second pad 302 is formed on the second-type semiconductor layer 313. A conductive line 23 is provided to electrically connect the first pads 301 of the light-emitting elements 40. Another conductive line 23 is provided to electrically connect the second pads 302 of the light-emitting elements 40 with each other. The two conductive lines 23 are formed on opposite sides of the conductive substrate 102. The structure shown in FIGS. 5D~5H can be applied to embodiments shown in FIG. 9A. That is, the structure with a control element and control line(s) can be used to control horizontal-type light-emitting element or vertical-type light-emitting element. Specifically, the control element can be connected to the conductive line 23 which is directly connected to the first pads 301 or the conductive line 23 which is directly connected to the second pads 302. The control lines can be formed on a side same as the control element or on a side opposite to the light-emitting stack in FIG. 9A.

Figure 9B:
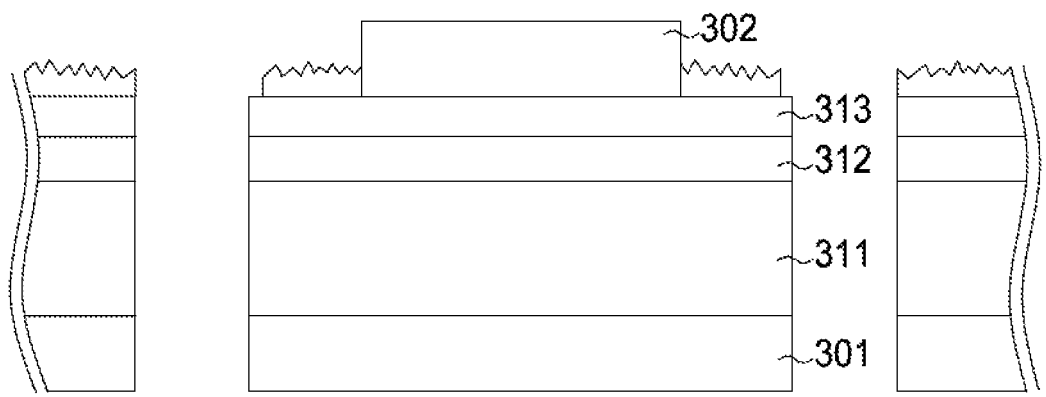
Figure 9C:
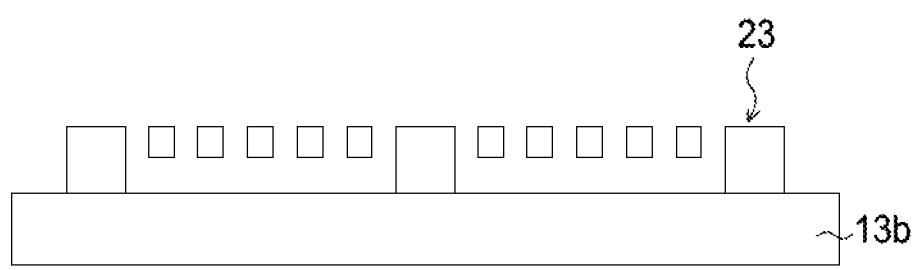
Figure 9D:
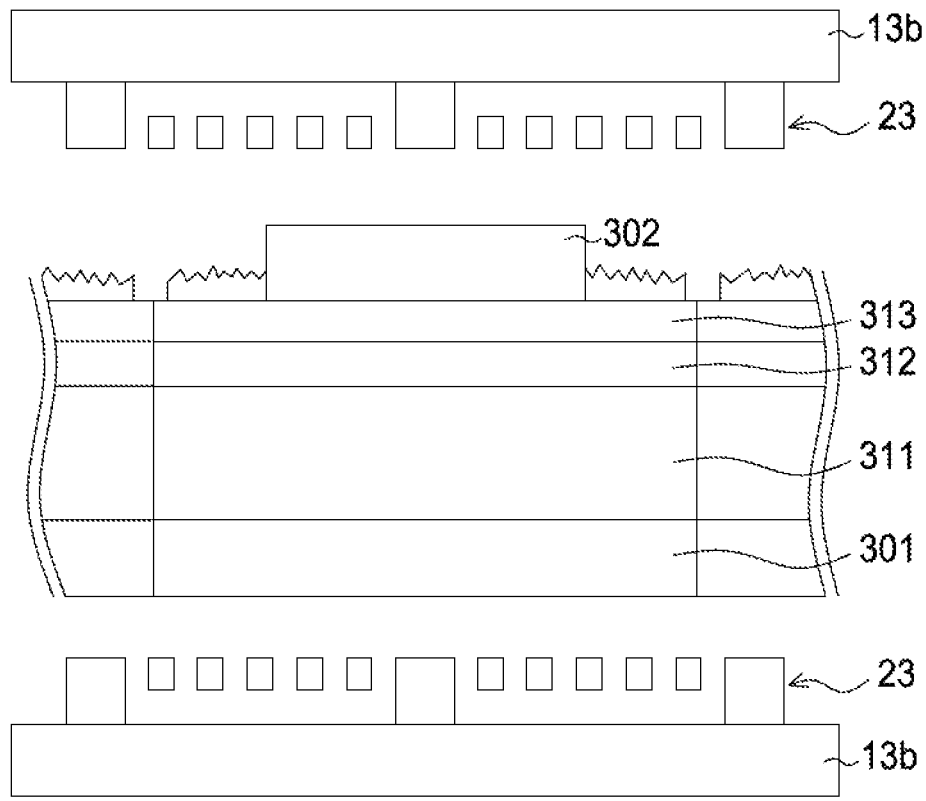
Figure 9E:
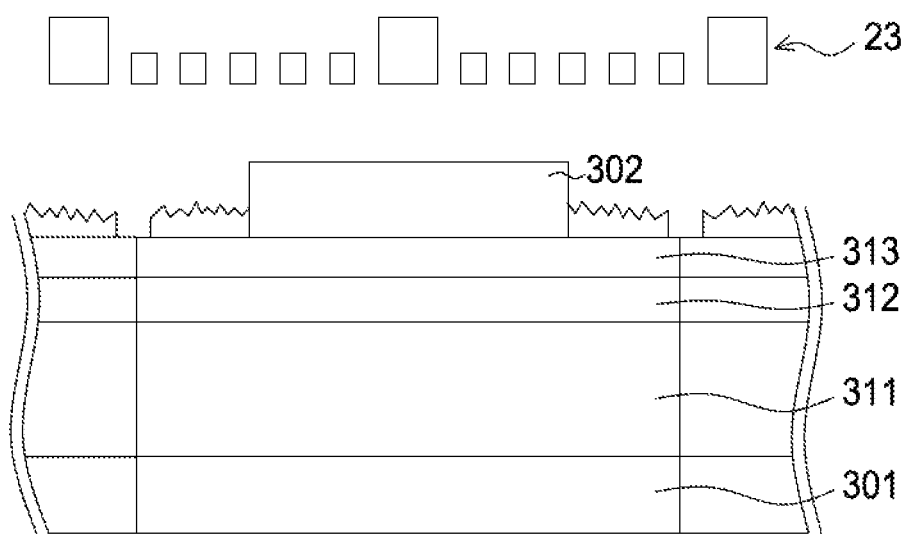
Figures 10A, 10B:
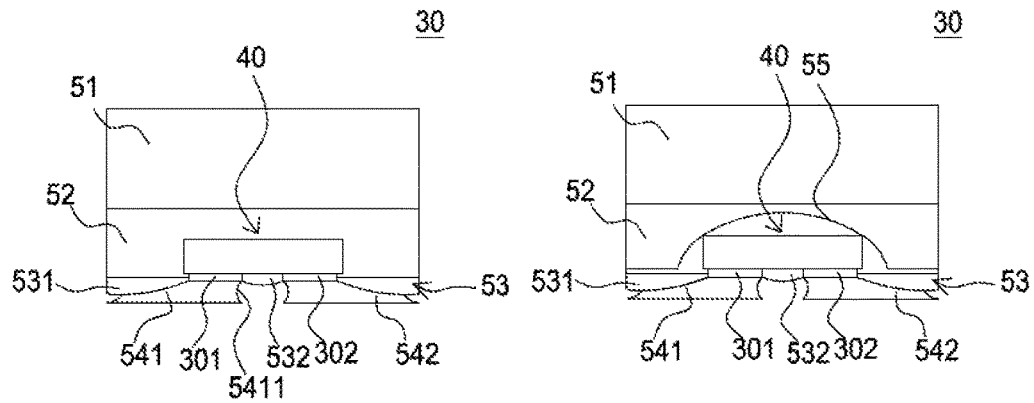
FIGS. 10A-10F show a structure of the light-emitting unit 30 in accordance with an embodiment of the present invention.

The process of manufacturing the structures shown in FIG. 9A is illustrated in FIGS. 9B~9E. Referring to FIGS. 9B~9C, a light-emitting stack including a first-type semiconductor layer 311, an active layer 312, and a second-type semiconductor layer 313 is provided with a first pads 301 and a second pads 302 which are respectively connected to the first-type semiconductor layer 311 and the second-type semiconductor layer 313; and a conductive line 23 is provided on a temporary substrate. Referring to FIGS. 9D~9E, two conductive lines 23 are attached to the first pad 301 and the second pad 302 of the light-emitting stack, and the temporary substrate is then removed to form a structure as shown in FIG. 9A FIGS. 10A-10F show a structure of the light-emitting unit 30 in accordance with the present invention. Referring to FIG. 10A, the light-emitting unit 30 includes a first transparent structure 52 enclosing the light-emitting element 40, a second transparent structure 51 formed on the first transparent structure 52. A reflective layer 53 is formed on the first transparent structure 52 opposite to the second transparent structure 51 and has a first portion 531 and a second portion 532 between the first pad 301 and the second pad 302. In this embodiment, the first portion 531 has a curved shape and a profile with a height gradually increasing from the light-emitting element 40 to an edge, away from the light-emitting element 40, of the first transparent structure 52. Besides, the second portion 532 also has a curved shape and a profile with a central region bulging away from the light-emitting element 40. A first enlarged pad 541 is formed on the first portion 531 and electrically connected to the first pad 301. A second enlarged pad 542 is formed on the first portion 531 and electrically connected to the second pad 302. In this embodiment, the first enlarged pad 541 (or the second enlarged pad 542) has a curve sidewall 5411.

As shown in FIG. 10B, the light-emitting unit 30 has a structure similar to that shown in FIG. 10A, except that a phosphor layer 55 is provided within the first transparent structure 52.

Figures 10C, 10D:
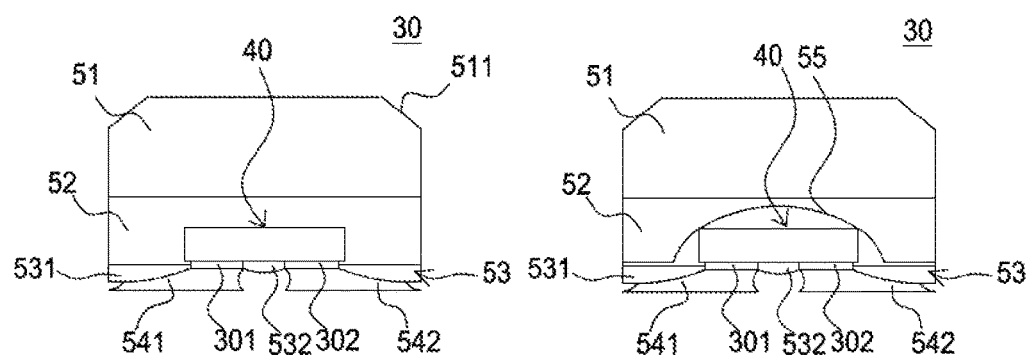

As shown in FIG. 10C, the light-emitting unit 30 has a structure similar to that shown in FIG. 10A, except that the second transparent structure 51 has a slanted sidewall 511.

As shown in FIG. 10D, the light-emitting unit 30 has a structure similar to that in FIG. 10C, except that a phosphor layer 55 is provided within the first transparent structure 52.

Figures 10E, 10F:
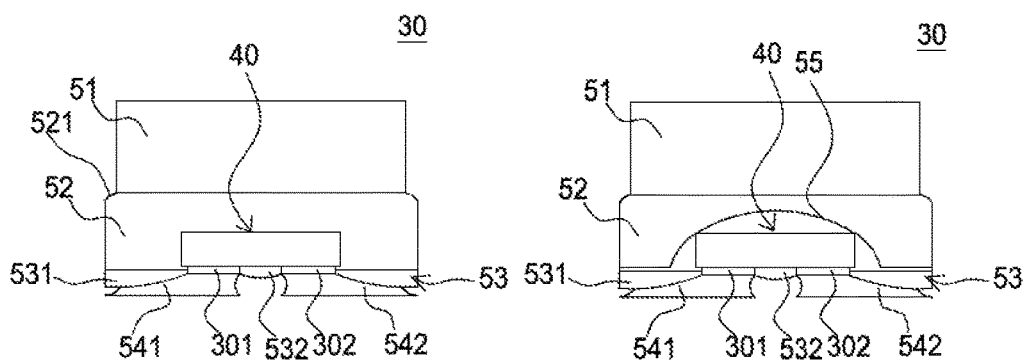
Figure 11A:
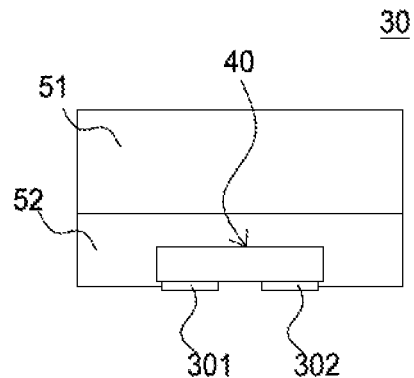
FIGS. 11A-11F show a structure of the light-emitting unit 30 in accordance with an embodiment of the present invention.
Figure 11B:
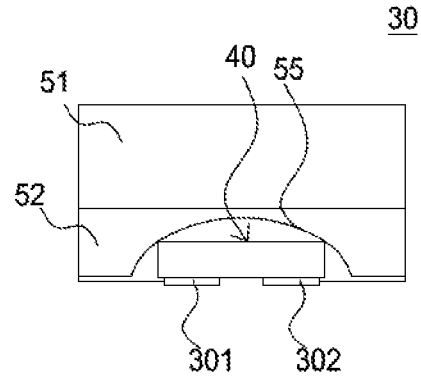
Figure 11C:
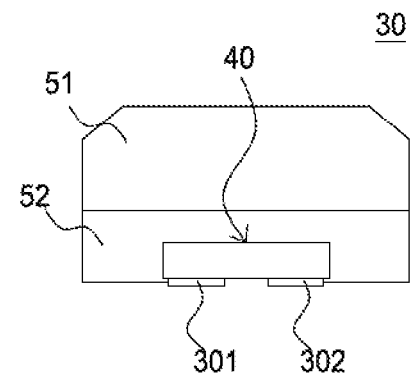
Figure 11D:
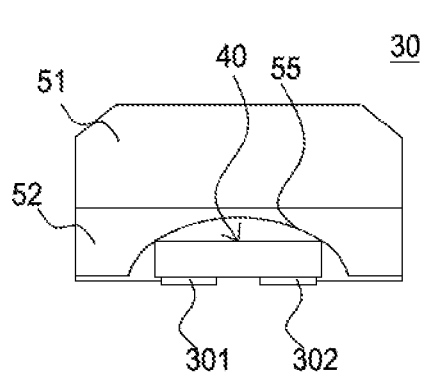
Figure 11E:
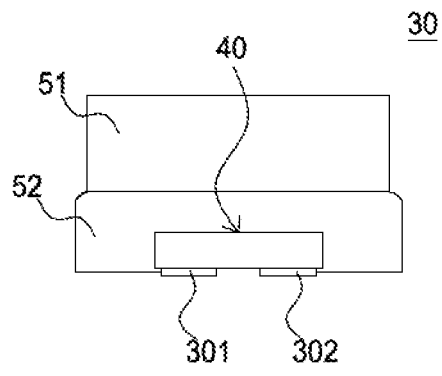
Figure 11F:
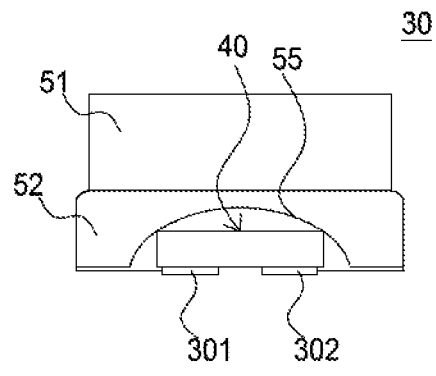

As shown in FIG. 10E, the light-emitting unit 30 has a structure similar to that in FIG. 10A, except that the first transparent structure 52 extends beyond the second transparent structure 51 and has an arc 521 close to the second transparent structure 51.

As shown in FIG. 10F, the light-emitting unit 30 has a structure similar to that in FIG. 10E, except that a phosphor layer 55 is provided within the first transparent structure 52.

FIGS. 11A-11F show a structure of the light-emitting unit 30 in accordance with the present invention. FIGS. 11A-11F respectively show a structure similar with those in FIGS. 10A-10F, except that the light-emitting unit 30 in these embodiments does not have the reflective layer and the enlarged pad.

Figure 12A:
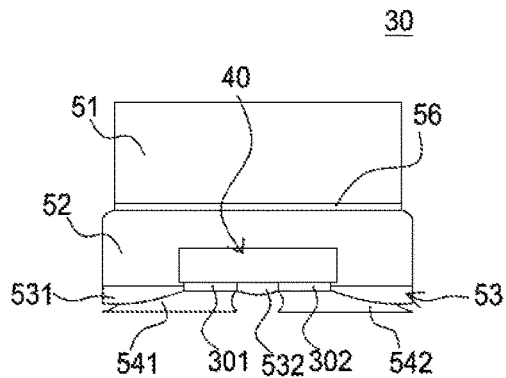
FIGS. 12A-12G show a structure of the light-emitting unit 30 in accordance with an embodiment of the present invention.
Figure 12B:
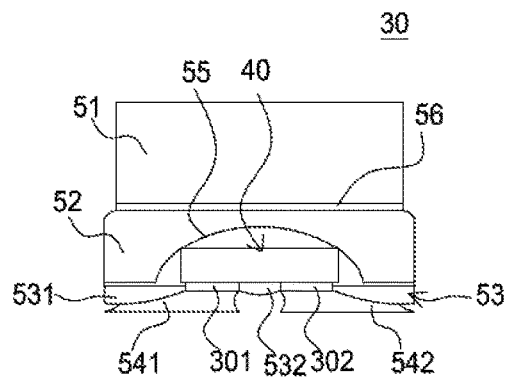
Figure 12C:
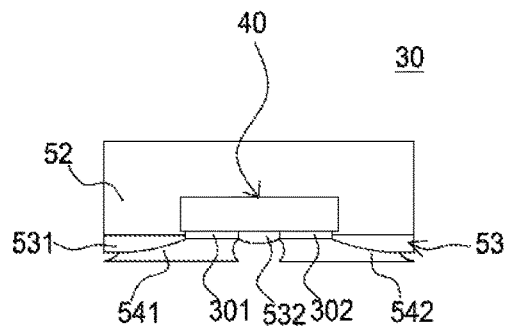
Figure 12D:
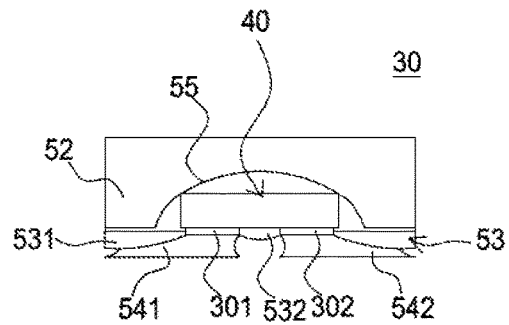
Figure 12E:
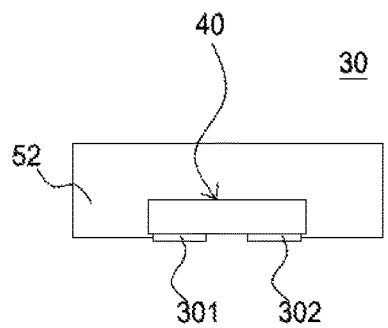
Figure 12F:
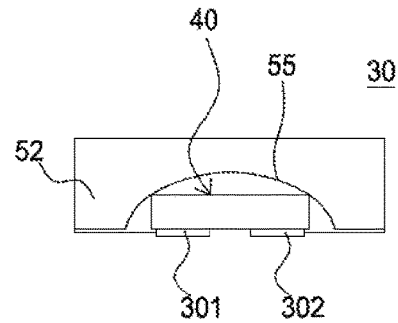
Figure 12G:
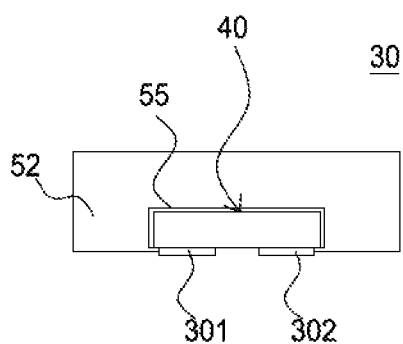

FIGS. 12A-12G show a structure of the light-emitting unit 30 in accordance with the present invention. FIGS. 12A and 12B have a structure similar to those shown in FIGS. 10E and 10F, except that a reflective structure 56, for example a DBR structure, is formed between the first transparent structure 52 and the second transparent structure 51. FIGS. 12C and 12D have a structure similar to those in FIGS. 10A and 10B, except that the light-emitting unit 30 is devoid of the second transparent structure 51 formed on the first transparent structure 52. FIGS. 12E and 12F have a structure similar to those in FIGS. 12C and 12D, except that the light-emitting unit 30 does not have the reflective layer 53 and the enlarged pad 541 and 542. FIG. 12G has a structure similar to that in FIG. 12F, except that the phosphor 55 is conformably formed on the light-emitting element 40.

Figure 13A:
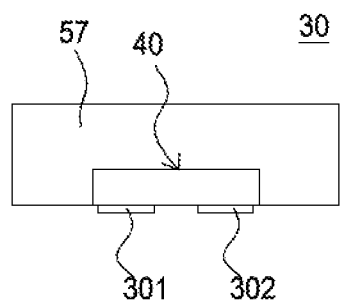
FIGS. 13A-13B show a structure of the light-emitting unit 30 in accordance with an embodiment of the present invention.
Figure 13B:
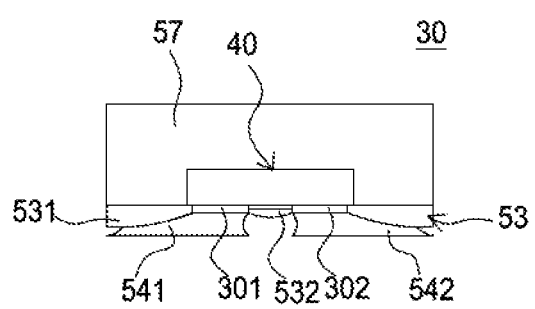

FIGS. 13A and 13B show a structure of the light-emitting unit 30 in accordance with the present invention. As shown in FIG. 13A, a phosphor structure 57 encloses the light-emitting element 40. FIG. 13B has a structure similar to that in FIG. 13A, except that the reflective layer 53 and the enlarged pad 541, 542 are provided.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

The invention claimed is:

1. A light-emitting array, comprising:
a first substrate;
a first light-emitting chip formed on the first substrate and comprising a light-emitting layer, a first corner, a second corner, a third corner, a fourth corner, a first pad, a second pad, and a third pad;
a second substrate separated from the first substrate;
a second light-emitting chip formed on the second substrate; and
a conductive line overlapped with the first substrate and the second substrate, electrically connected to the first light-emitting chip and the second light-emitting chip, and comprising a first segment and a second segment located on a virtual plane that is substantially parallel to the first pad,
wherein the first segment and the second segment have different radius curvatures,
wherein the first pad is arranged to cover both of the first corner and the second corner, the second pad is arranged to cover the third corner, and the third pad is arranged to cover the fourth corner,
wherein the first pad has a first portion arranged on the first corner, a second portion arranged on the second corner, a third portion directly connecting the first portion and the second portion along a diagonal line of the first light-emitting chip,
wherein the third portion is narrower than the first portion and the second portion,
wherein the second pad has a base portion and is free from any portion extending from the base portion toward the first pad, the first corner or the second corner, and
wherein the first substrate has an area larger than that of the first light-emitting chip and the second substrate has an area larger than that of the second light-emitting chip.

2. The light-emitting array of claim 1, wherein the first corner and the second corner are located in a first diagonal line of the first light-emitting chip, and the third corner and the fourth corner are located in a second diagonal line of the first light-emitting chip.

3. The light-emitting array of claim 1, wherein the conductive line comprises a first portion connected to the second light-emitting chip, and a second portion connected to the first portion, and the first portion has a width larger than the second portion has.

4. The light-emitting array of claim 1, wherein the conductive line comprises a stretchable segment having a width W, a first vertex, and a second vertex which is separated from the first vertex by a distance L, a ratio between the width W, and the distance L is between 0.1~0.4.

5. The light-emitting array of claim 1, further comprising:
a first conductive line having a first area connected to the first pad; and
a second conductive line having a second area connected to the second pad,
wherein the first area is larger than the second area.

6. The light-emitting array of claim 5, wherein the first conductive line comprises a connection portion not directly connected to the first light-emitting chip, and a width ratio between the connection portion and the first light-emitting chip is between 2 to 10.

* * * * *